United States Patent
Lung et al.

(10) Patent No.: US 8,426,294 B2
(45) Date of Patent: *Apr. 23, 2013

(54) 3D MEMORY ARRAY ARRANGED FOR FN TUNNELING PROGRAM AND ERASE

(75) Inventors: Hsiang-Lan Lung, Ardsley, NY (US);
Yen-Hao Shih, Elmsford, NY (US);
Erh-Kun Lai, Elmsford, NY (US);
Ming-Hsiu Lee, Hsinchu (TW);
Hang-Ting Lue, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 13/476,964

(22) Filed: May 21, 2012

(65) Prior Publication Data

US 2012/0231613 A1    Sep. 13, 2012

Related U.S. Application Data

(62) Division of application No. 12/705,158, filed on Feb. 12, 2012, now Pat. No. 8,203, 187.

(60) Provisional application No. 61/209,095, filed on Mar. 3, 2009.

(51) Int. Cl.
*H01L 29/76*    (2006.01)
(52) U.S. Cl.
USPC .......................... 438/479; 438/197; 438/257
(58) Field of Classification Search .................. 438/479, 438/197, 257
See application file for complete search history.

(56) References Cited

U.S. PATENT DOCUMENTS

| | | | |
|---|---|---|---|
| 6,034,882 | A | 3/2000 | Johnson et al. |
| 6,906,361 | B2 | 6/2005 | Zhang |
| 6,906,940 | B1 | 6/2005 | Lue |
| 7,081,377 | B2 | 7/2006 | Cleeves |
| 7,129,538 | B2 | 10/2006 | Lee et al. |

(Continued)

FOREIGN PATENT DOCUMENTS

| EP | 1936681 A1 | 6/2008 |
|---|---|---|
| EP | 2048709 A2 | 4/2009 |

OTHER PUBLICATIONS

Choi et al., "Performance Breakthrough in NOR Flash Memory with Dopant-Segregated Schottky-Barrier (DSSB) SONOS Device", 2009 Symposium on VLSI Technology Digest of Technical Papers, Jun. 16-18, 2009, pp. 1-2.

(Continued)

*Primary Examiner* — Long Pham
(74) *Attorney, Agent, or Firm* — Haynes Beffel & Wolfeld LLP

(57) ABSTRACT

A 3D memory device includes an array of semiconductor body pillars and bit line pillars, dielectric charge trapping structures, and a plurality of levels of word line structures arranged orthogonally to the array of semiconductor body pillars and bit line pillars. The semiconductor body pillars have corresponding bit line pillars on opposing first and second sides, providing source and drain terminals. The semiconductor body pillars have first and second channel surfaces on opposing third and fourth sides. Dielectric charge trapping structures overlie the first and second channel surfaces, providing data storage sites on two sides of each semiconductor body pillar in each level of the 3D array. The device can be operated as a 3D AND-decoded flash memory.

18 Claims, 27 Drawing Sheets

U.S. PATENT DOCUMENTS

| | | |
|---|---|---|
| 7,177,169 B2 | 2/2007 | Scheuerlein |
| 7,274,594 B2 | 9/2007 | Pascucci et al. |
| 7,315,474 B2 | 1/2008 | Lue |
| 7,382,647 B1 | 6/2008 | Gopalakrishnan |
| 7,420,242 B2 | 9/2008 | Lung |
| 7,851,849 B2 | 12/2010 | Kiyotoshi |
| 8,203,187 B2 * | 6/2012 | Lung et al. .................... 257/390 |
| 2005/0280061 A1 | 12/2005 | Lee |
| 2007/0140001 A1 | 6/2007 | Motoi et al. |
| 2008/0073635 A1 | 3/2008 | Kiyotoshi et al. |
| 2008/0096327 A1 | 4/2008 | Lee et al. |
| 2008/0101109 A1 | 5/2008 | Haring-Bolivar et al. |
| 2008/0180994 A1 | 7/2008 | Katsumata et al. |
| 2008/0247230 A1 | 10/2008 | Lee et al. |
| 2008/0285350 A1 | 11/2008 | Yeh |
| 2009/0097321 A1 | 4/2009 | Kim et al. |
| 2009/0184360 A1 | 7/2009 | Jin et al. |
| 2010/0270593 A1 | 10/2010 | Lung et al. |

OTHER PUBLICATIONS

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Anti-fuse Memory Cells" IEEE J. of Solid-State Circuits, vol. 38, No. 11, Nov. 2003.

Jung et al., "Three Dimensionally Stacked NAND Flash Memory Technology Using Stacking Single Crystal Si Layers on ILD and TANOS Structure for Beyond 30nm Node", IEEE Int'l Electron Devices Meeting, Dec. 11-13, 2006.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory", IEEE Int'l Electron Devices Meeting, Dec. 11-13, 2006.

Lai et al., "Highly Reliable MA BE-SONOS (Metal-Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory", 2007 Symposium on VLSI Technology Digest of Technical Papers; Jun. 12-14, 2007, pp. 14-15.

U.S. Appl. No. 12/430,290, filed Apr. 27, 2009 entitled Integrated Circuit 3D Memory Array and Manufacturing Methods by inventors Hsiang-Ian Lung and Hang-Ting Lue, consisting of 44 pages.

Jung et al., "Three Dimensionally Stacked NAND Flash Memory Technology Using Stacking Single Crystal Si Layers on ILD and TANOS Structure for Beyond 30nm Node," IEEE IEDM 2006, Dec. 11-13, 4 pages.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 2007, pp. 449-452.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

* cited by examiner

3D MEMORY ARRAY ARRANGED FOR FN TUNNELING PROGRAM AND ERASE

This application is a division of co-pending U.S. patent application Ser. No. 12/705,158 filed on 12 Feb. 2010, which application claims the benefit of U.S. Provisional Application No. 61/209,095, entitled Memory Structure, filed on 3 Mar. 2009, and both such applications are incorporated by reference as if fully set forth herein.

BACKGROUND OF THE INVENTION

1. Field of the Invention

The present invention relates to high density memory devices, and particularly to memory devices in which multiple planes of memory cells are arranged to provide a three-dimensional 3D array.

2. Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory", IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node", IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells" IEEE J. of Solid-State Circuits, vol. 38, no. 11, November 2003. In the design described in Johnson et al., multiple layers of word lines and bit lines are provided, with memory elements at the cross-points. The memory elements comprise a p+ polysilicon anode connected to a word line, and an n-polysilicon cathode connected to a bit line, with the anode and cathode separated by anti-fuse material.

In the processes described in Lai, et al., Jung, et al. and Johnson et al., there are several critical lithography steps for each memory layer. Thus, the number of critical lithography steps needed to manufacture the device is multiplied by the number of layers that are implemented. Critical lithography steps are expensive, and so it is desirable to minimize them in manufacturing integrated circuits. So, although the benefits of higher density are achieved using 3D arrays, the higher manufacturing costs limit the use of the technology.

Another structure that provides vertical NAND cells in a charge trapping memory technology is described in Tanaka et al., "Bit Cost Scalable Technology with Punch and Plug Process for Ultra High Density Flash Memory", 2007 Symposium on VLSI Technology Digest of Technical Papers; 12-14 Jun. 2007, pages: 14-15. The structure described in Tanaka et al. includes a multi-gate field effect transistor structure having a vertical channel which operates like a NAND gate, using silicon-oxide-nitride-oxide-silicon SONOS charge trapping technology to create a storage site at each gate/vertical channel interface. The memory structure is based on a pillar of semiconductor material arranged as the vertical channel for the multi-gate cell, with a lower select gate adjacent the substrate, and an upper select gate on top. A plurality of horizontal control gates is formed using planar electrode layers that intersect with the pillars. The planar electrode layers used for the control gates do not require critical lithography, and thereby save costs. However, many critical lithography steps are required for each of the vertical cells. Also, there is a limit in the number of control gates that can be layered in this way, determined by such factors as the conductivity of the vertical channel, program and erase processes that are used and so on.

A 3D anti-fuse memory structure is described in U.S. Pat. No. 7,420,242, entitled Stacked Bit Line Dual Word Line Nonvolatile Memory, by Hsiang-Lan Lung which can be made using fewer lithographic steps than other prior art structures. In U.S. Pat. No. 7,420,242, anti-fuse memory elements are formed on both sides of horizontal bit lines that lie in a plurality of levels and vertical pillars between the horizontal bit lines extending down through the plurality of levels to two lower levels of horizontal wordlines underneath, where one word line level is coupled to a pillar on one side of a bit line and the other word line level is coupled to a pillar on another side of the bit line. This provides high density, anti-fuse memory.

It is desirable to provide a structure for three-dimensional integrated circuit memory with a low manufacturing cost, including reliable, very small memory elements that can be erased and programmed.

SUMMARY OF THE INVENTION

A 3D, AND-type, charge trapping memory device is implemented on a single integrated circuit substrate. The device can be made using a process that does not require extra lithographic steps for each level of the structure, and with high density. Memory cells in the device are programmed and erased using charge tunneling between the channel in a semiconductor body pillar, and the gate in a word line, and are read using current through the channel between bit line pillars adjacent the semiconductor body pillars as controlled by gate voltages on the word lines.

A 3D array of memory cells is described based on a plurality of two-cell structures arranged in three dimensions. The two-cell structures include a semiconductor body pillar, first and second bit line pillars on opposing first and second sides of the semiconductor body pillar, dielectric charge trapping structures, or other data storage structures, on third and fourth opposing sides of the semiconductor body pillar, a first word line arranged adjacent the dielectric charge trapping structure on the third side of the semiconductor body pillar and a second word line arranged adjacent the dielectric charge trapping structure on the fourth side of the semiconductor body pillar. A controller is coupled to the array, and arranged to program and erase selected memory cells in the plurality of two-cell structures by biasing corresponding semiconductor body pillars and one of the first or second word lines to induce Fowler-Nordheim tunneling. Alternative approaches can employ single cell structures, in which the word line and data storage structure on the third side are used as a memory cell, while on the other side one or both of the data storage structure and word line are not formed or are otherwise not configured for use as a memory cell.

A device described herein includes an array of semiconductor body pillars and bit line pillars on the substrate, dielectric charge trapping structures, and a plurality of levels of word line structures arranged orthogonally to the array of semiconductor body pillars and bit line pillars. The semiconductor body pillars have corresponding bit line pillars on opposing first and second sides, providing source and drain terminals. The semiconductor body pillars have first and second channel surfaces on opposing third and fourth sides. Dielectric charge trapping structures overlie the first and second channel surfaces, providing data storage sites on two sides of each semiconductor body pillar in each level of the 3D array. The array of pillars can be provided by implementing rows of alternating semiconductor body pillars and bit line pillars using n-type and p-type doped semiconductor material as appropriate for n-channel and p-channel cells, with the sides of the rows coated with a multilayer, dielectric charge trapping structure. The multilayer dielectric charge trapping structure is described in more detail below. Examples of multilayer charge trapping structures include a SONOS-type ONO structure and a BE-SONOS-type ONONO structure.

Multiple levels of cells are implemented on the array of semiconductor body pillars and bit line pillars using word line structures on each level, so that cells are formed at the cross points of the channel surfaces on semiconductor body pillars and word line structures in each level, with multilayer charge trapping structures in between, providing the 3D array of memory cells. Thus, in a device described herein, a plurality of levels of word line structures are arranged orthogonally to the array of semiconductor body pillars and bit line pillars. The word line structures include a first set of word lines, coupled in common to a first driver on for example the left side of the structure, arranged adjacent the dielectric charge trapping structures between alternating pairs of rows of semiconductor body pillars and bit line pillars, and a second set of word lines interleaved with the first set, and coupled in common to a second driver on for example the right side of the structure, arranged adjacent the dielectric charge trapping structures between interleaved alternating pairs of rows of semiconductor body pillars and bit line pillars. This results in word lines that provide gates adjacent the dielectric charge trapping structures on the first channel surfaces and second channel surfaces of the semiconductor body pillars, and thereby provides two independently addressable memory cells in each level on each semiconductor body pillar.

Decoder circuitry is coupled to the array of semiconductor body pillars and bit line pillars, and to the drivers on the plurality of levels of word line structures. The decoder circuitry is arranged to access selected memory cells in the 3D array. The decoder circuitry can be arranged for random access AND-decoding. In an example described here, the decoder circuitry includes an array of access devices in the substrate coupled to the semiconductor body pillars in the array, arranged to access individual semiconductor body pillars. The decoder circuitry also includes a row decoder coupled by bit line conductors on the top of the array to the bit line pillars on the first side of the semiconductor body pillars, and arranged to access individual rows (e.g., parallel to word lines) of bit line pillars. The decoder circuitry also includes a column decoder coupled by bit line conductors on the bottom of the array to bit line pillars on the second sides of the semiconductor body pillars, arranged to access individual columns of bit line pillars on the second side of the semiconductor body pillars. The array of access devices can share the row decoder and column decoder with the top and bottom bit line conductors. The decoder circuitry also includes a memory plane and word line decoder, which is coupled to the drivers for the plurality of word line structures, and arranged to access one of a first set and second set of word lines on individual levels in the structure.

The memory device can also be implemented in an alternative in which the rows of semiconductor body pillars and bit line pillars are arranged in unit source-channel-drain sets, where a unit set comprises a first bit line pillar, the semiconductor body pillar adjacent the first bit line pillar, a second bit line pillar adjacent the semiconductor body pillars and an insulating member, implementing a source-channel-drain-insulator pattern. In this alternative, the insulating member isolates adjacent source-channel-drain sets, suppressing the disturbance of memory cells that are adjacent a selected cell during programming, erasing and reading.

The memory device includes control circuits and biasing circuits to bias selected memory cells in the 3D array for gate-side Fowler-Nordheim (FN) programming and gate-side Fowler-Nordheim erasing operations, and suppressing disturbance of charge stored in cells not selected for access.

A method for operating the 3D, AND-type charge trapping memory array is described, based on gate-side injection FN electron and hole tunneling. To program a selected memory cell, the semiconductor body line and word line element coupled to the selected cell are biased (e.g. −15V to a selected word line on one side of pillar, ground to body pillar for an n-channel cell, −8 V to an unselected word line on other side of pillar) to create an electric field for gate injection electron tunneling, while the other semiconductor body lines are turned off, although capacitively boosted by the unselected word line biasing. Unselected word lines on the same level and on other levels in the 3D array are biased (e.g. −8V for n-channel cell) to prevent disturb.

A method for manufacturing a memory device is provided. The method includes providing an integrated circuit substrate having an array of access devices for connection to individual semiconductor body pillars, and rows of bit line conductors for connection to columns of bit line pillars on the first sides of the semiconductor body pillars. A corresponding array of contacts is included on a surface for the access devices and the bit line conductors. Alternating layers of insulating material and word line material are formed over the surface of the substrate, to establish a plurality of levels of word line material. A plurality of trenches is etched through the plurality of levels of word line material, orthogonal to the bit line conductors in the substrate, and exposing contacts in the array of contacts on the surface for both the access devices and the bit line conductors. Charge trapping structures are formed on the sidewalls of the trenches, at least over the word line material exposed on the sidewalls in the plurality of levels. The trenches are filled with a semiconductor material having a first type dopant, and then etched to define semiconductor body pillars within the trenches in contact with corresponding contacts for the access devices, and leaving openings on opposing first and second sides of the semiconductor body pillars. The openings are filled with a bit line pillar, including semiconductor material having an opposite type dopant to define first bit line pillars on the first side to the semiconductor body pillars contacting the contacts for the bit lines in the substrate, and second bit line pillars on the second sides of the semiconductor body pillars (arranged for contacting bit lines on top). As result of this process, the semiconductor body pillars have channel surfaces on third and fourth opposing sides in contact with the charge trapping structures on sidewalls of the trenches. The plurality of levels of word line material is etched to form interleaved left and right word line elements between alternating pairs of rows, and coupled to the charge trapping structures on the third and fourth opposing sides of the semiconductor body pillars. A plurality of bit line conductors is formed on top, for connection to columns of bit line pillars on the second sides of the semiconductor body pillars. The bit line conductors, access devices and word line elements are connected to decoding circuits on the substrate, arranged as discussed above.

The process for manufacturing described herein requires few lithographic steps, and is therefore practical and low-cost compared to other 3D memory processes.

Other aspects and advantages of the present invention can be seen on review of the drawings, the detailed description and the claims, which follow.

DETAILED DESCRIPTION

A detailed description of embodiments of the present invention is provided with reference to the FIGS. 1-26.

Figure 1:
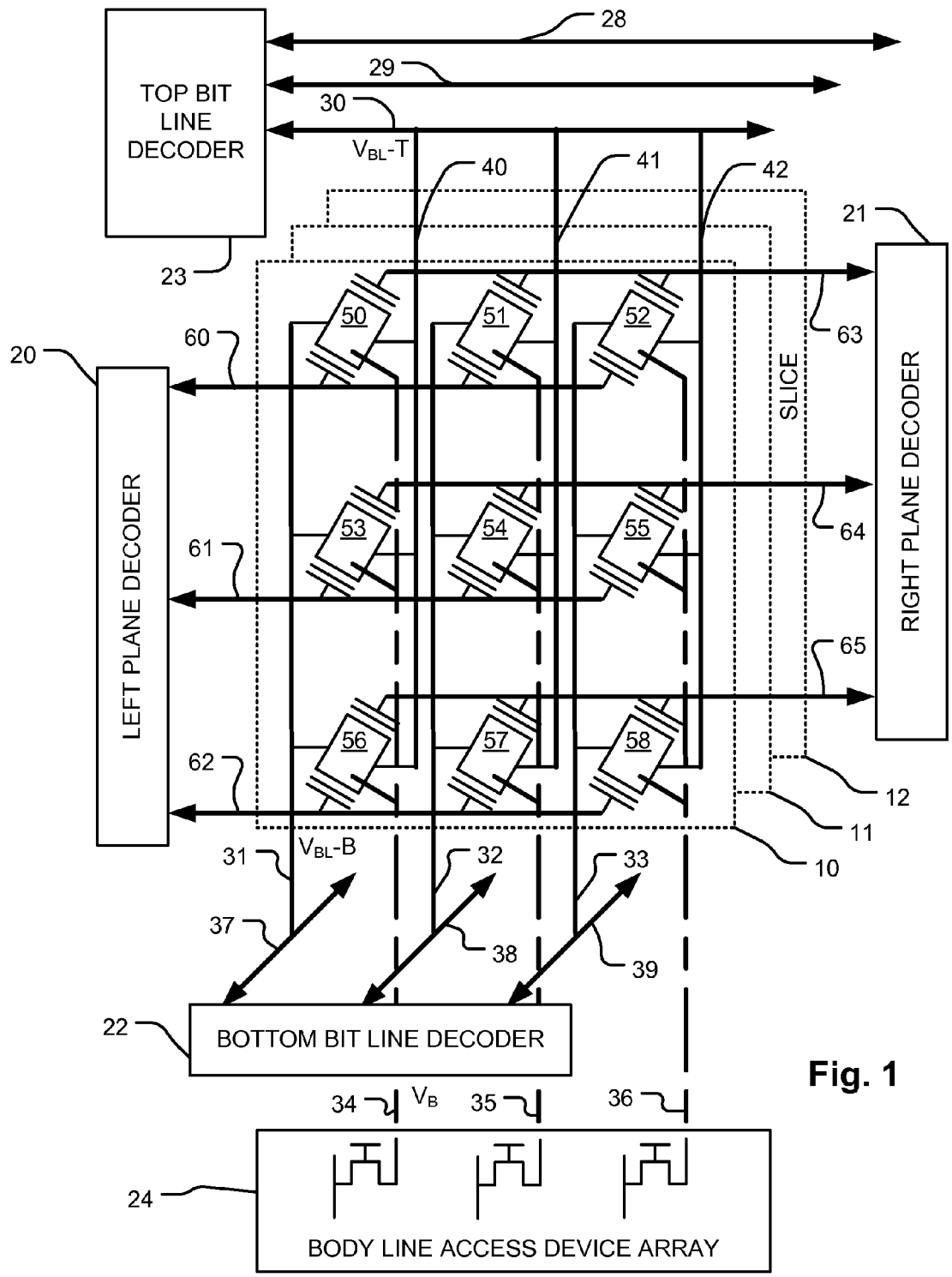
FIG. 1 is a schematic illustration showing an X-Z slice view of a 3D memory structure configured for AND-decoding, as described herein.

FIG. 1 is a schematic diagram of a 3D memory device, showing "slices" 10, 11, 12 which lie in X-Z planes of the 3D structure. In the illustrated schematic, there are nine two-cell unit structures 50-58, each unit structure having two memory cells having separate charge storage structures and left and right gates. Embodiments of the 3D memory device can include many two-cell unit structures per slice. The device includes an array of cells arranged for AND-type decoding, using a left plane decoder 20, right plane decoder 21, top bit line (row) decoder 23, bottom bit line (column) decoder 22 and body line access device array 24. The semiconductor bodies of the two-cell unit structures in a Z-direction column (e.g. 50, 53, 56) are coupled via a semiconductor body pillar (e.g. 34) to an access device in a body line access device array 24, implemented in the integrated circuit substrate beneath the structure. Likewise, the semiconductor bodies for the two-cell unit structures 51, 54, 57 are coupled via a semiconductor body pillar 35 to a corresponding access device in the body line access device array 24. The semiconductor bodies for the two-cell unit structures 52, 55, 58 are coupled via the semiconductor body pillar 36 to the body line access device array 24.

The left gates on the two-cell unit structures in a particular level (e.g. 50, 51, 52) in all of the slices 10, 11, 12 are coupled via a word line element 60 to a driver selected by left plane decoder 20. Likewise, the right gates on the unit structures in a particular level (e.g. 50, 51, 52) in all of the slices 10, 11, 12 are coupled via a word line element 63 to a driver selected by right plane decoder 21. The left gates and right gates on the level including unit structures 53, 54, 55 are coupled via the word line element 61 to the left plane decoder 20 and via word line element 64 to the right plane decoder 21, respectively. The left gates and right gates on the level including unit structures 56, 57, 58 are coupled via word line element 62 to the left plane decoder 20 and via word line element 65 to the right plane decoder 21, respectively.

Source/drain terminals on the right side of the unit structures in a Z-direction column (e.g. 50, 53, 56) in this schematic are coupled via a bit line pillar (40, 41, 42) to a bit line conductor (28, 29, 30) arranged in the X-direction along columns of cells, implemented in the integrated circuit substrate above the structure, and coupled to a top bit line decoder 23. Source/drain terminals on the left side of the unit structures in a Z-direction column (e.g. 50, 53, 56) in the schematic are coupled via a bit line pillar 31, 32, 33 to a bit line conductor 37, 38, 39 arranged along Y-direction columns, implemented beneath the 3D structure, and coupled to a bottom bit line decoder 23. Source/drain terminals on the left side and source/drain terminals on the right side of the unit structures 51, 54, 57 are coupled to bit line pillars 32 and 41, respectively, which are coupled to the top bit line conductor 30 and bottom bit line conductor 38, respectively. Source/drain terminals on the left side and source drain terminals on the right side of the unit cells 52, 55, 58 are coupled to bit line pillars 33 and 42, respectively, which are coupled to the top bit line conductor 30 and bottom bit line conductor 39, respectively. The bit line pillars can be metal strapped or metal silicide strapped for improved conductivity.

As can be seen, a current path for reading an individual cell (e.g. one of the two cells in unit structure 53) is established by selecting an X-direction row on the bit line conductor (30) using top bit line decoder 23, and a Y-direction column on the bit line conductor (37) using bottom bit line decoder 22. A gate voltage is applied to an individual cell in a unit structure in a particular level using the left plane decoder 20 to select a word line element 61, and right plane decoder 21 to select a word line element 64. Individual semiconductor bodies for a Z-direction column can be selected for biasing using the X- and Y-decoded body line access device array 24.

Figure 2:
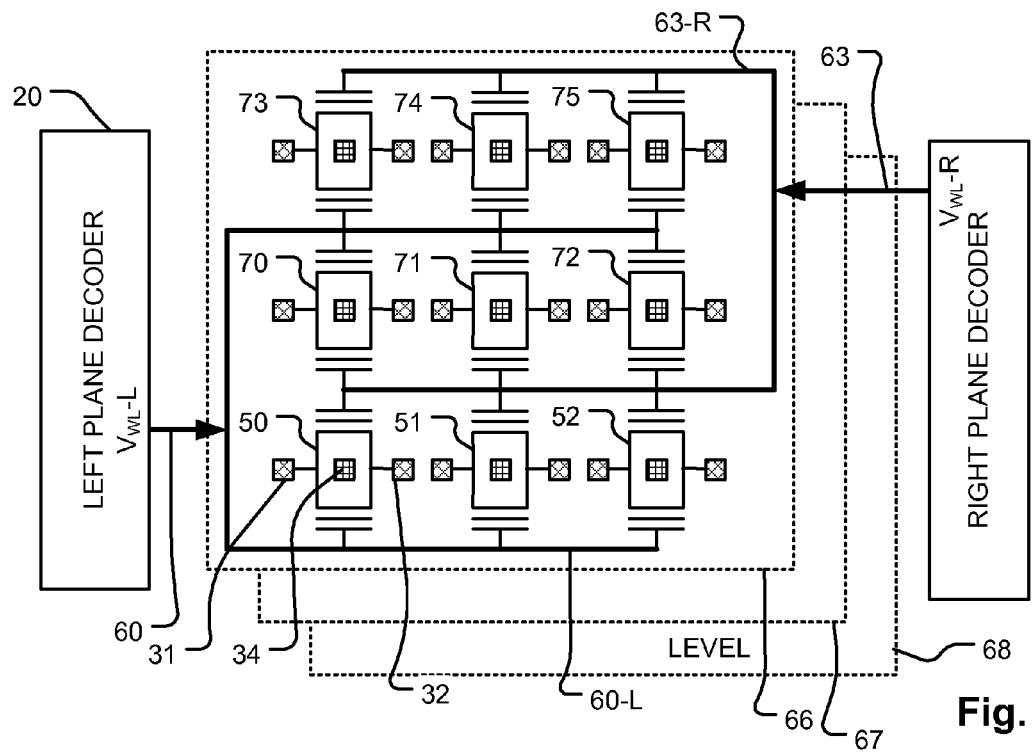
FIG. 2 is a schematic illustration showing an X-Y level view of a 3D memory structure configured for AND-decoding, as described herein.

FIG. 2 is a schematic diagram of a 3D memory device, showing "levels" 66, 67, 68, which lie in X-Y planes of the 3D structure. The left plane decoder 20 and right plane decoder 21 are illustrated in the figure. Each level in the schematic includes 9 two-cell unit structures. Embodiments can include many cells per level. The front row of unit structures in level 66 in the schematic includes structures 50, 51 and 52, corresponding to the top row in the slice shown in FIG. 1. The balance of the two-cell unit structures 70-75 complete a 3-by-3, X-Y arrangement of unit structures on the level. As shown in FIG. 2, the left word line element 60 is arranged to connect to the gates between alternating pairs of rows using a forked word line element 60-L. Likewise, the right word line element 63 is interleaved with the left word line element 60, and arranged to connect to the gates between the other alternating pairs of rows using forked word line element 63-R.

Figure 3:
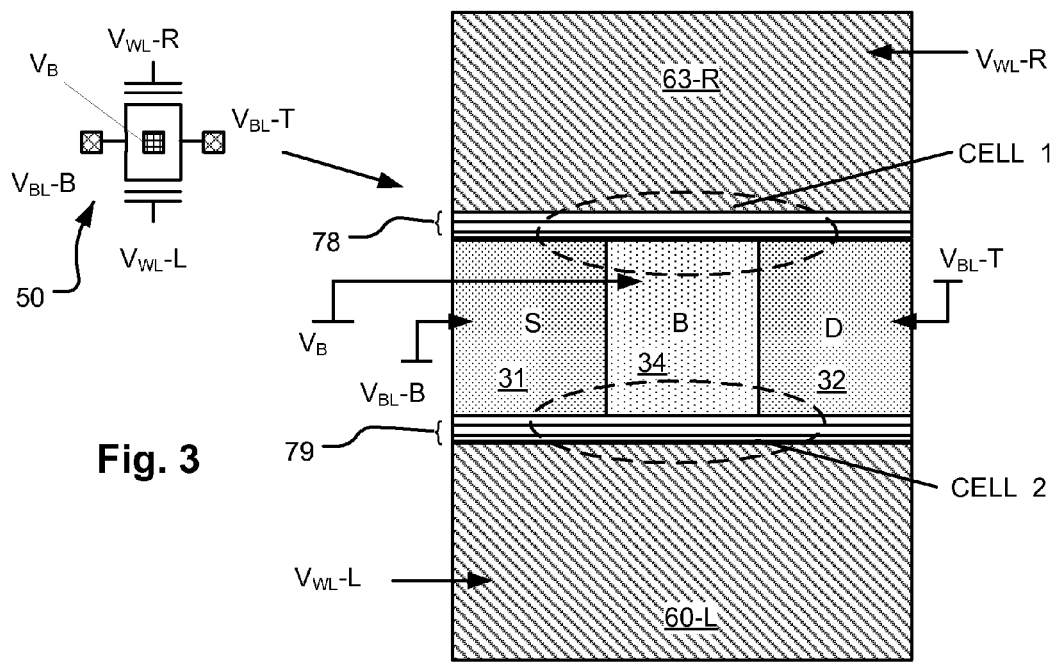
FIG. 3 shows the structure of a 2 bit unit cell along with the symbol for the unit cell utilized in FIG. 1 and FIG. 2 of the 3D memory structure.

The two-cell unit structure is shown in FIG. 3. The symbol 50 which is utilized in FIG. 1 and FIG. 2 representing the unit structure can be represented by the structure shown, including word line element 60-L, word line element 63-R, the semiconductor body pillar 34, a first bit line pillar 31, and a second bit line pillar 32. The dielectric charge storage structures 78, 79 lie on opposing sides of the semiconductor body pillar 34 and between respective channel surfaces on opposing sides of the semiconductor body pillar 34 and the corresponding gates provided by the word line elements, 60-L or 63-R. Thus, two memory cells are provided by this unit structure, including CELL 1 and CELL 2 as labeled in the drawing, each cell including a source, a drain, a charge trapping element and a gate.

Bias voltages applied to the unit structures include the right word line voltage $V_{WL}$-R, the left word line voltage $V_{WL}$-L, the bottom bit line voltage $V_{BL}$-B, the top bit line voltage $V_{BL}$-T and the body line voltage $V_B$. Self boosting caused by capacitive coupling of voltage from word lines to unselected, floating, semiconductor body lines helps prevent program disturb conditions. The following table shows representative operating voltages for the terminals in read, gate injection program and gate injection erase modes for the two cells (c1 and c2) in the unit structures. Of course the voltage levels will be adjusted as suits a particular implementation and programming or erasing method.

|  | Read-c1 | Read-c2 | Prog-c1 | Prog-c2 | Erase-c1 | Erase-c2 |
| --- | --- | --- | --- | --- | --- | --- |
| Sel. $V_{WL}$-R | +2 V | 0 V | −15 V | −8 V | +15 V | +15 V |
| Sel. $V_{WL}$-L | 0 V | +2 V | −8 V | −15 V | +15 V | +15 V |
| Sel. $V_{BL}$-B | $V_S$ | $V_S$ | Floating | Floating | Floating | Floating |
| Sel. $V_{BL}$-T | $V_D$ | $V_D$ | Floating | Floating | Floating | Floating |
| Sel. $V_B$ | Floating or 0 V | Floating or 0 V | 0 V | 0 V | 0 V | 0 V |
| Unsel. $V_{WL}$-R | 0 V | 0 V | −8 V | −8 V | Floating | Floating |
| Unsel. $V_{WL}$-L | 0 V | 0 V | −8 V | −8 V | Floating | Floating |
| Unsel. $V_{BL}$-B | 0 V | 0 V | Floating | Floating | Floating | Floating |
| Unsel. $V_{BL}$-T | 0 V | 0 V | Floating | Floating | Floating | Floating |
| Unsel. $V_B$ | Floating | Floating | Floating | Floating | Floating | Floating |

Figure 4:
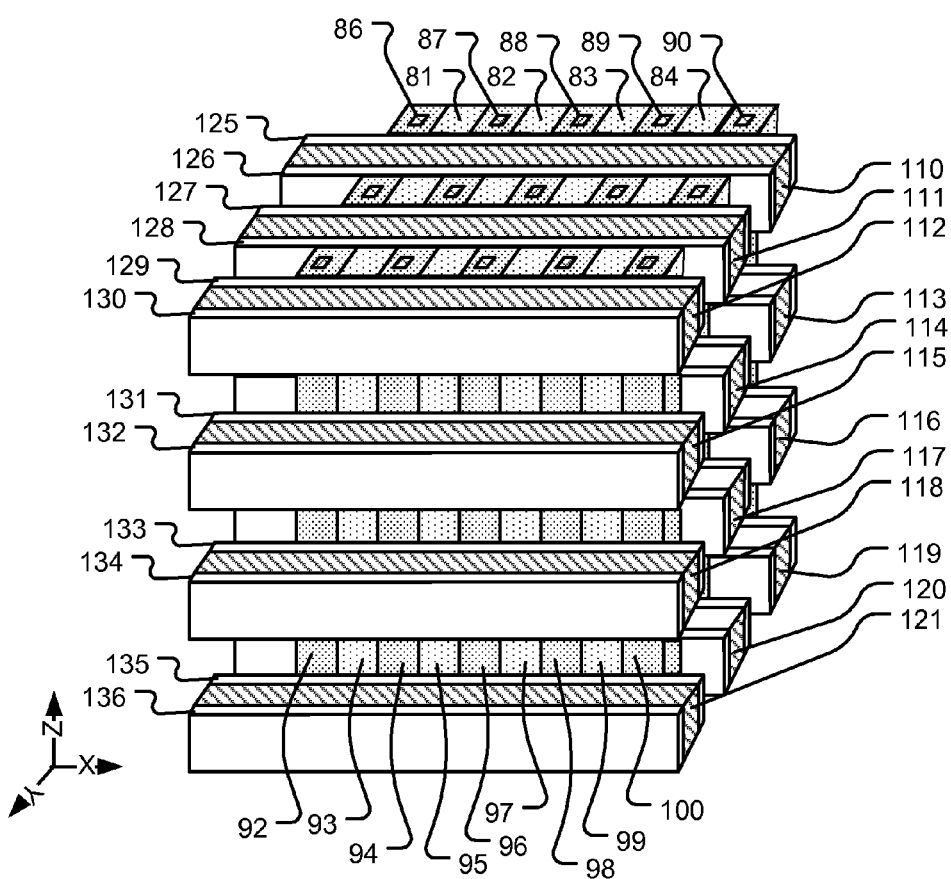
FIG. 4 is a perspective drawing of a portion of a 3D memory structure described herein.

FIG. 4 shows a portion of a 3D structure including an array of memory cells as described with reference to FIGS. 1-3. Four levels of word lines are illustrated, where a top level includes word lines 110-112 extending in the X-direction, a next lower level includes word lines 113-115, a next level includes word lines 116-118, and a bottom level includes word lines 119-121. Charge storage structures 125-130 are formed on the opposing sides of the word lines 110-112 on the top level. Charge storage structures 131-132 are formed on opposing sides of word line 115, charge storage structures 133-134 are formed on the opposing side of word line 118 and charge storage structures 135-136 are formed on opposing sides of word line 121. Similar charge storage structures are formed on the sides of the other word lines in the structure as well. The structure includes an array of semiconductor body pillars, including pillars 81-84 in the back of the structure shown, and pillars 93, 95, 97 and 99 on the front of the structure shown. Between and on opposing sides of the semiconductor body pillars, bit line pillars are formed. Thus, bit line pillars 86, 87, 88, 89 and 90 are shown on opposite sides of semiconductor body pillars 81-84. Bit line pillars 92, 94, 96, 98 and 100 are shown on opposing sides of the semiconductor body pillars 93, 95, 97 and 99. The top bit line conductors (not shown) overlie the structure, extending in the X-direction across the bit line pillars 87-90 and 92-94, 89-98, etc. Bottom bit line conductors (not shown) underlie the structure, extending in the Y-direction, coupled to semiconductor bit line pillars along the Y-direction column (e.g. in the column including pillars 92 and 86).

Figure 5:
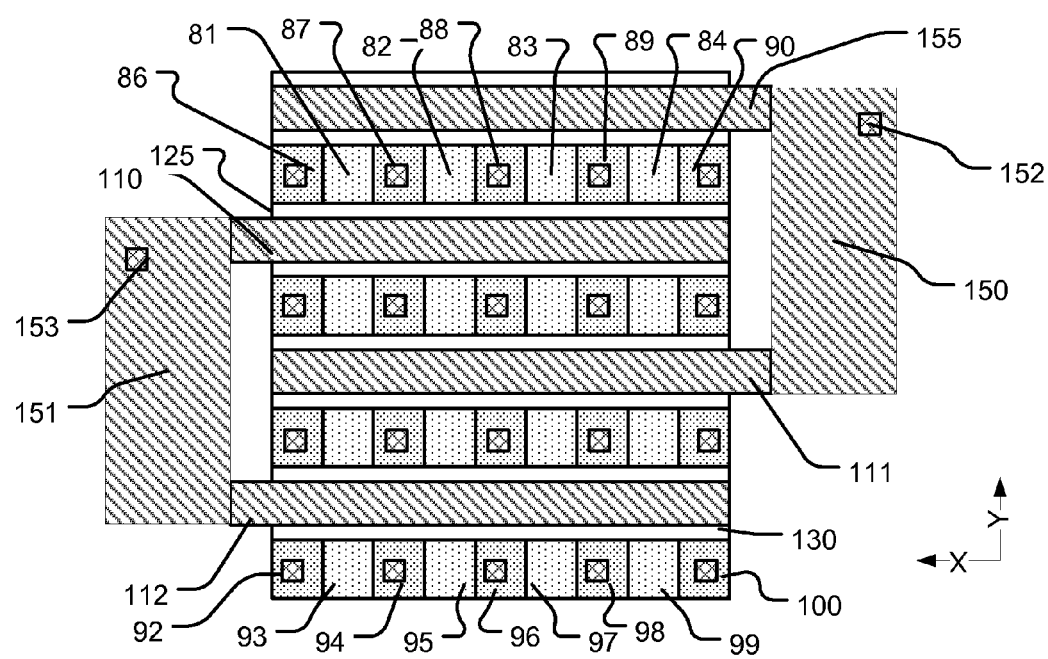
FIG. 5 is a layout view in the X-Y plane of a level of the 3D memory structure described herein.

FIG. 5 shows a layout view of a level showing three of the interleaved word lines 110-112 from the top level of FIG. 4 and an extra word line 155, with extensions 150, 151 for connection of the word lines (110, 111, 112 and 155) to the left and right plane decoders. The reference numerals used in FIG. 4 are repeated in FIG. 5 where appropriate. As can be seen, the word lines 110, 112 are coupled to an extension 151 which is adapted for connection to a contact plug on a landing area 153, through which connection to a decoder circuit on the integrated circuit substrate can be made. Likewise, word lines 155, 111 are coupled to an extension 150 which is adapted for connection to a contact plug on landing area 152, through which connection to a decoder circuit on the integrated circuit substrate can be made. A structure for making connection to the multiple levels is described below with reference to FIG. 18.

Figure 6:
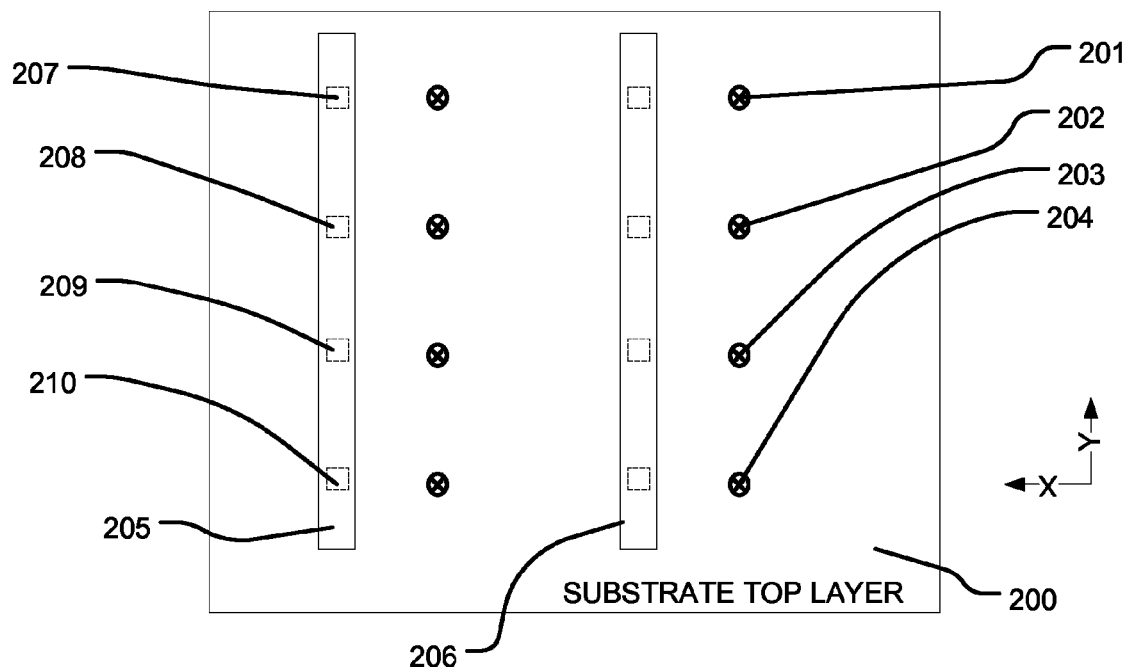
FIGS. 6-15 show a sequence of stages of a manufacturing process for making the 3D memory structure described herein.

FIGS. 6-15 illustrate stages in a process for manufacturing the structure discussed above. In FIG. 6, a surface 200 of an integrated circuit substrate is illustrated with an array of contacts for connection to the 3D structure. The array of contacts includes a first set of contacts, including contacts 201-204 which are coupled to individual access devices, and adapted for connection to the semiconductor body lines in the 3D structure. The individual access devices can be formed in the substrate, and may include for example MOS transistors having gates coupled to word lines arranged to the X-direction, sources coupled to the source lines arranged in the Y-direction, and drains connected to the contacts (e.g. 201-204). The individual access devices are selected by biasing the word lines and source lines as appropriate for the particular operation. The array of contacts includes contact areas 207-210 on the bottom bit line conductors 206, 205 arranged in the Y-direction, adapted for connection to left side bit line pillars in the 3D structure is described above in the contact areas 207-210.

Figure 7:
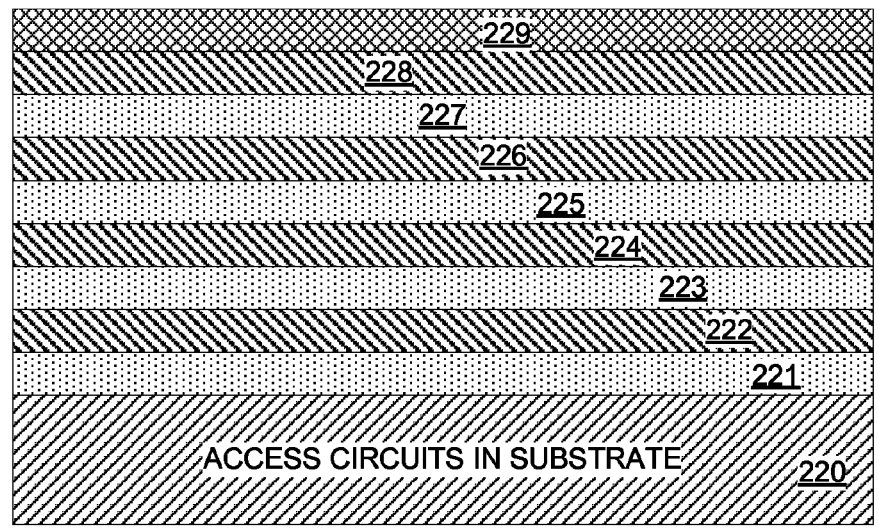

FIG. 7 is a side cross-section showing a multilayer stack of materials at a first stage in the manufacturing process, after forming alternating layers 221, 223, 225, 227 of insulating material, such as silicon dioxide or silicon nitride, and layers 222, 224, 226, 228 of word line material, such as n+-polysilicon, on top of the substrate 220. In a representative structure, the thicknesses of the alternating layers of insulating material can be about 50 nanometers, and the thicknesses of the alternating layers of word line material can be about 50 nanometers. Over the top of the alternating layers, a layer 229 of hard mask material, such as silicon nitride, can be formed.

Figure 8:
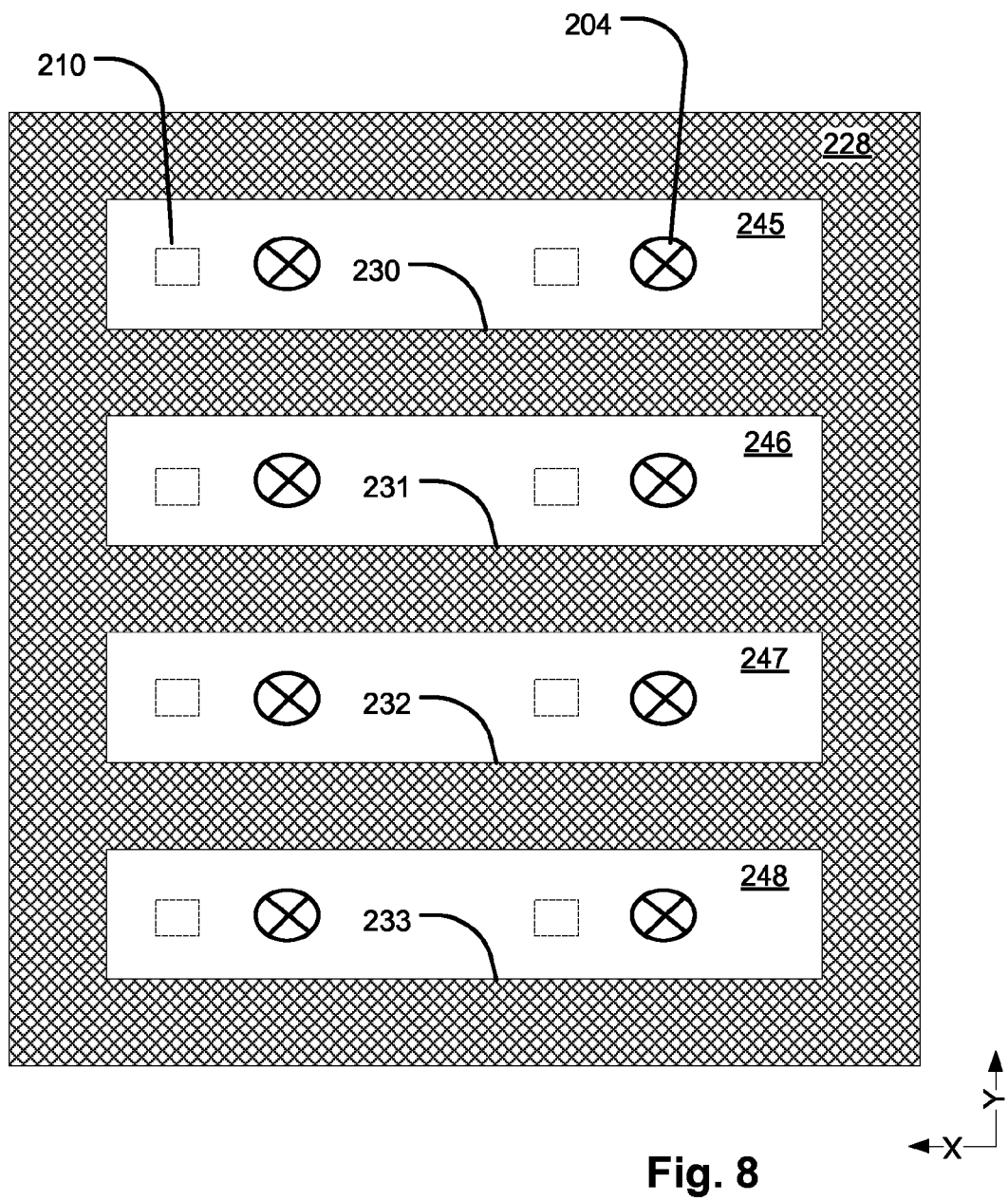

FIG. 8 is a layout view from a perspective over layer 229 showing the results using a first lithographic process to define a pattern for the trenches, and a patterned etch of the stack to form trenches 245-248 through the multilayer stack of materials shown in FIG. 7, exposing bottom bit line conductors, such as contact area 210, and contacts, such as contact 204, coupled to individual access devices in the body line access circuits. Anisotropic reactive ion etching techniques can be used to etch through the polysilicon and silicon oxide or silicon nitride layers, with a high aspect ratio. The trenches have sidewalls 230-233 on which the layers of word line material are exposed at each level of the structure. The widths of the trenches 245-248 in a representative structure can be about 50 nanometers.

Figure 9:
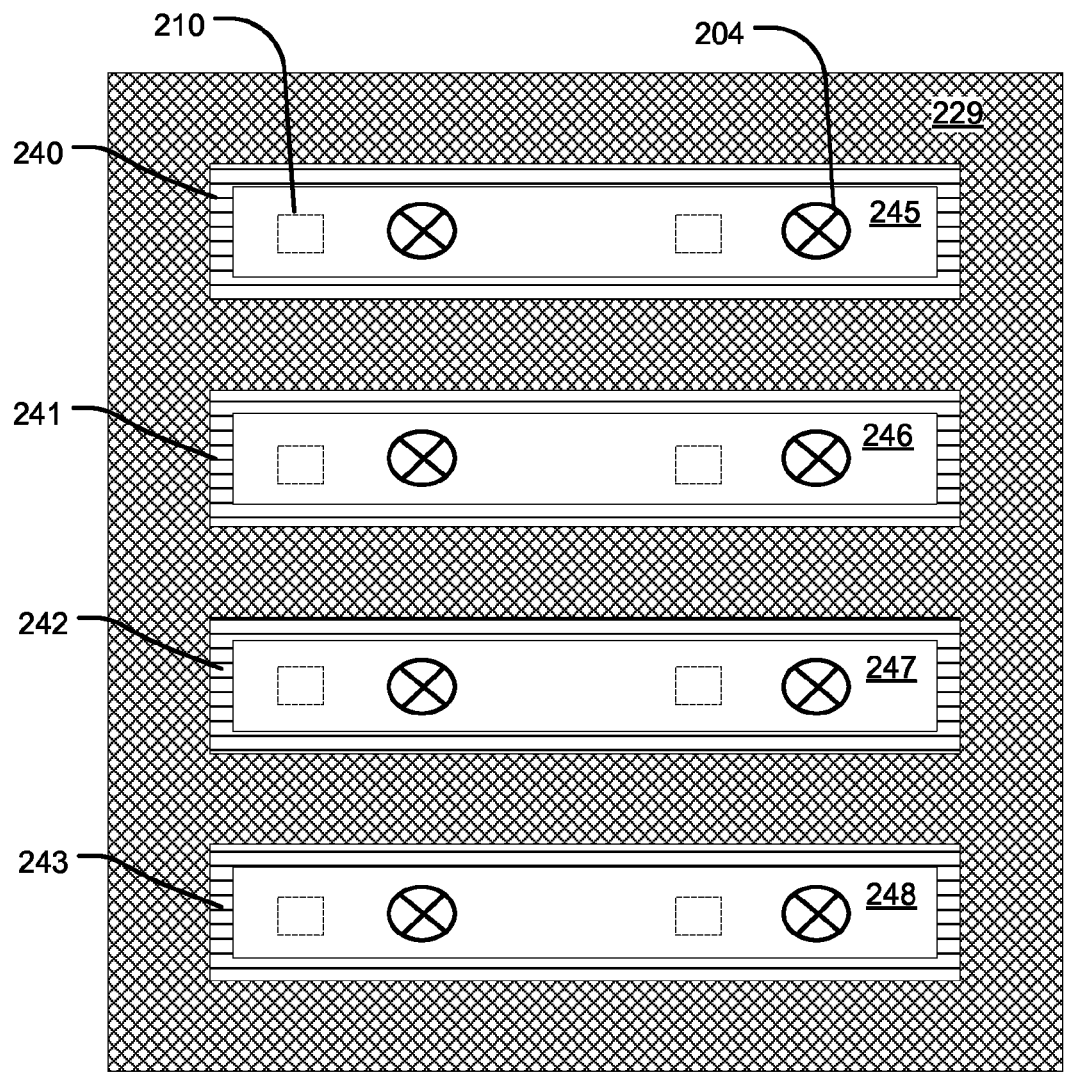

FIG. 9 shows a later stage in the process after deposition of the multilayer charge trapping structures (240-243) over and on the sidewalls of the trenches (245-248) contacting the layers of word line material. A representative structure and process is described below with reference to FIG. 17. After deposition of the multilayer charge trapping structures, the process includes depositing a thin protective layer, such as p-type polysilicon over the multilayer charge trapping structures, and etching the resulting formation using an anisotropic process to remove the material of the multilayer charge trapping structures (240-243) from the bottom of the trenches, 245-248, and exposing the bottom bit line conductors and contacts (e.g. 210, 204).

The charge trapping structures 240-243 include a tunneling layer in contact with the word line material, the charge trapping layer over the tunneling layer, and a blocking layer over the charge trapping layer, such as used in typical charge trapping memory devices. For example, the tunneling layer may comprise a layer of silicon dioxide or silicon oxide nitride, a charge trapping layer may comprise a layer of silicon nitride or other charge trapping material, and the blocking layer may comprise a layer of silicon dioxide or a high-K material typical in SONOS type memory devices. In alternatives, as explained below with reference to FIG. 17, a bandgap engineered charge trapping structure can be utilized.

Figure 10:
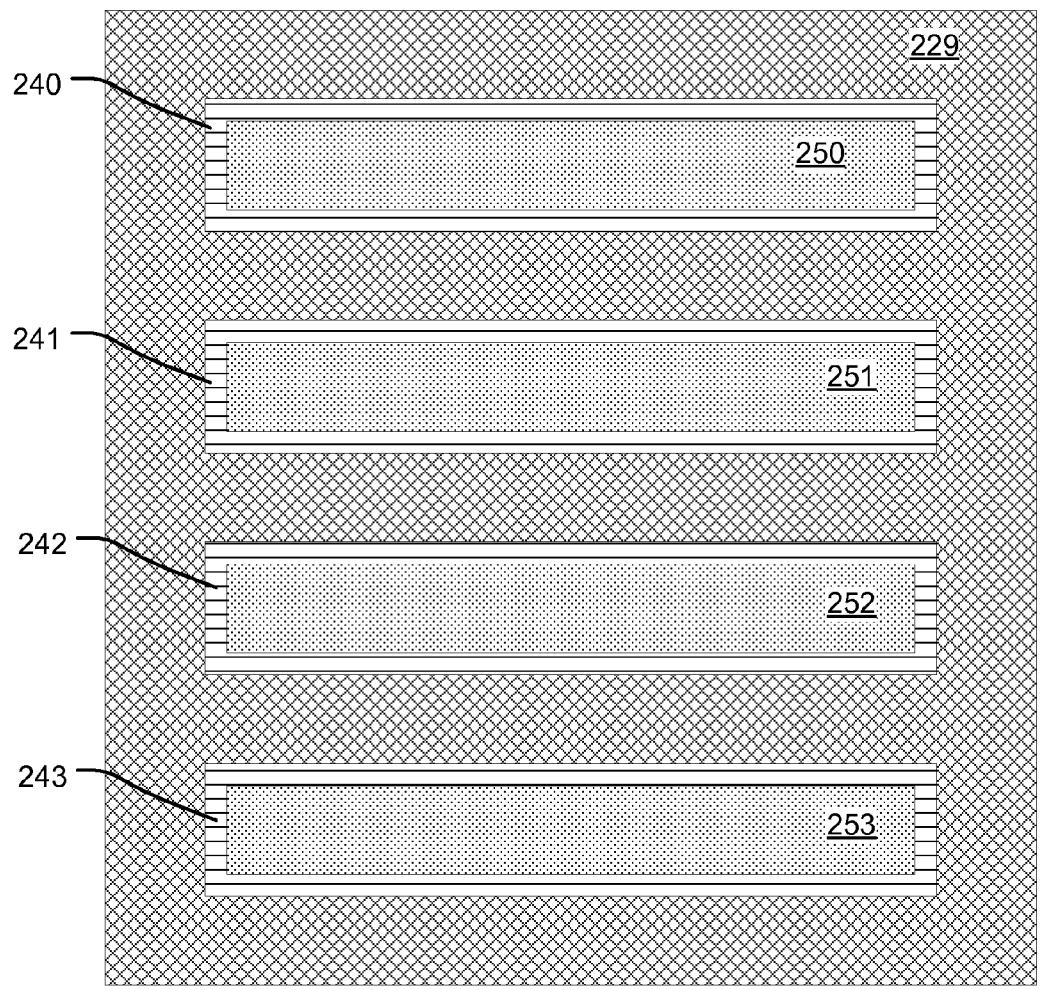

FIG. 10 shows a next stage in the process after filling the trenches with the material to be used for the semiconductor body lines, such as p-type polysilicon, to form filled trenches 250-253. The semiconductor body lines contact the blocking layers of the charge trapping structures 240-243.

Figure 11:
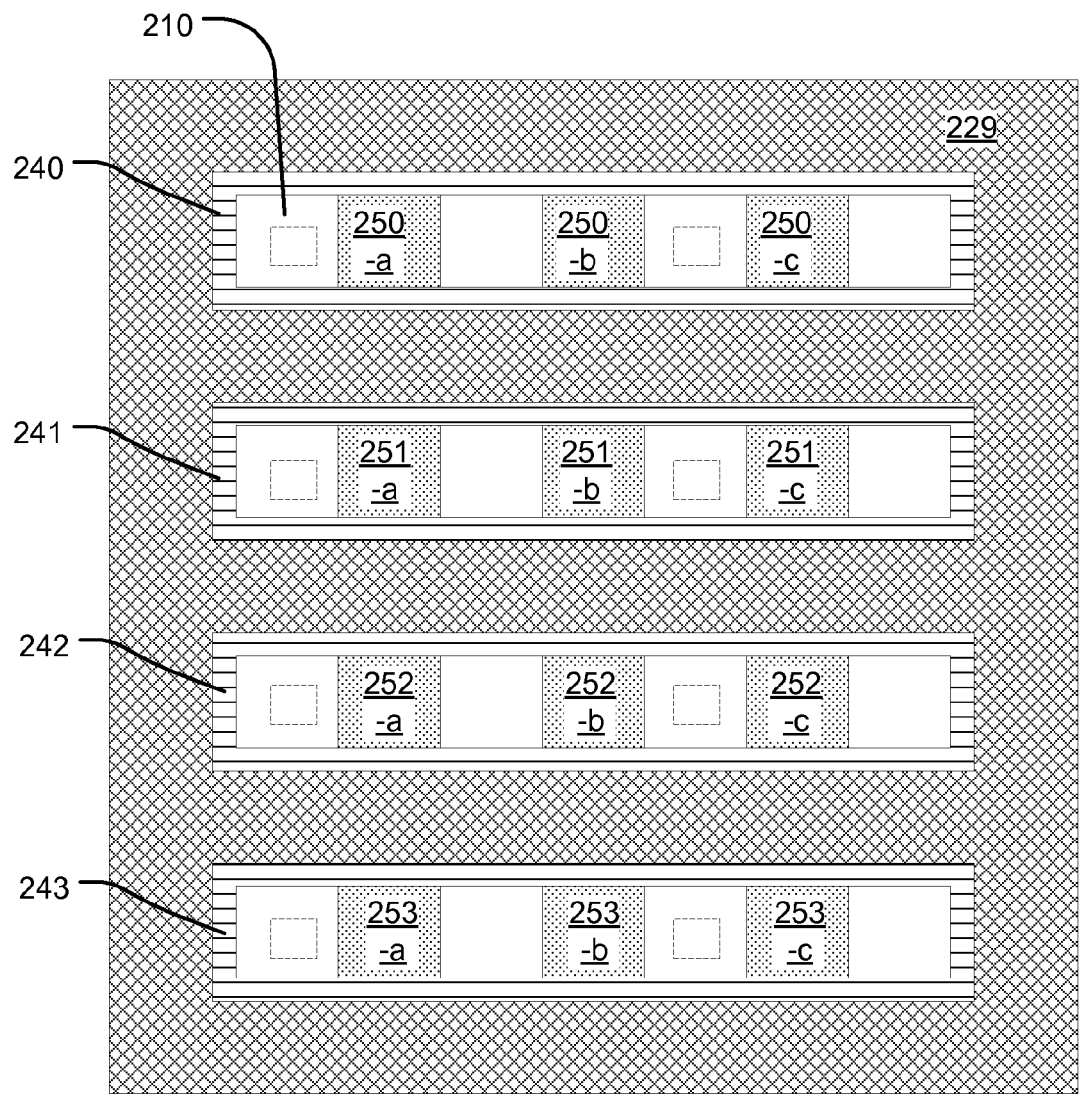

FIG. 11 shows the result of using a second lithographic process to define a pattern for the semiconductor body lines, and a patterned etch of the filled trenches, using an anisotropic etch process that is selective for the material of the semiconductor body lines, to define the semiconductor body pillars (250-a, 250-b, 250-c, 251-a, 251-b, 251-c, 252-a, 252-b, 252-c, 253-a, 253-b, 253-c) contacting the contacts, including contact 204 (not shown) to the underlying individual access devices, and to create vertical openings between the semiconductor body lines exposing bottom bit line conductors, including contact area 210.

Figure 12:
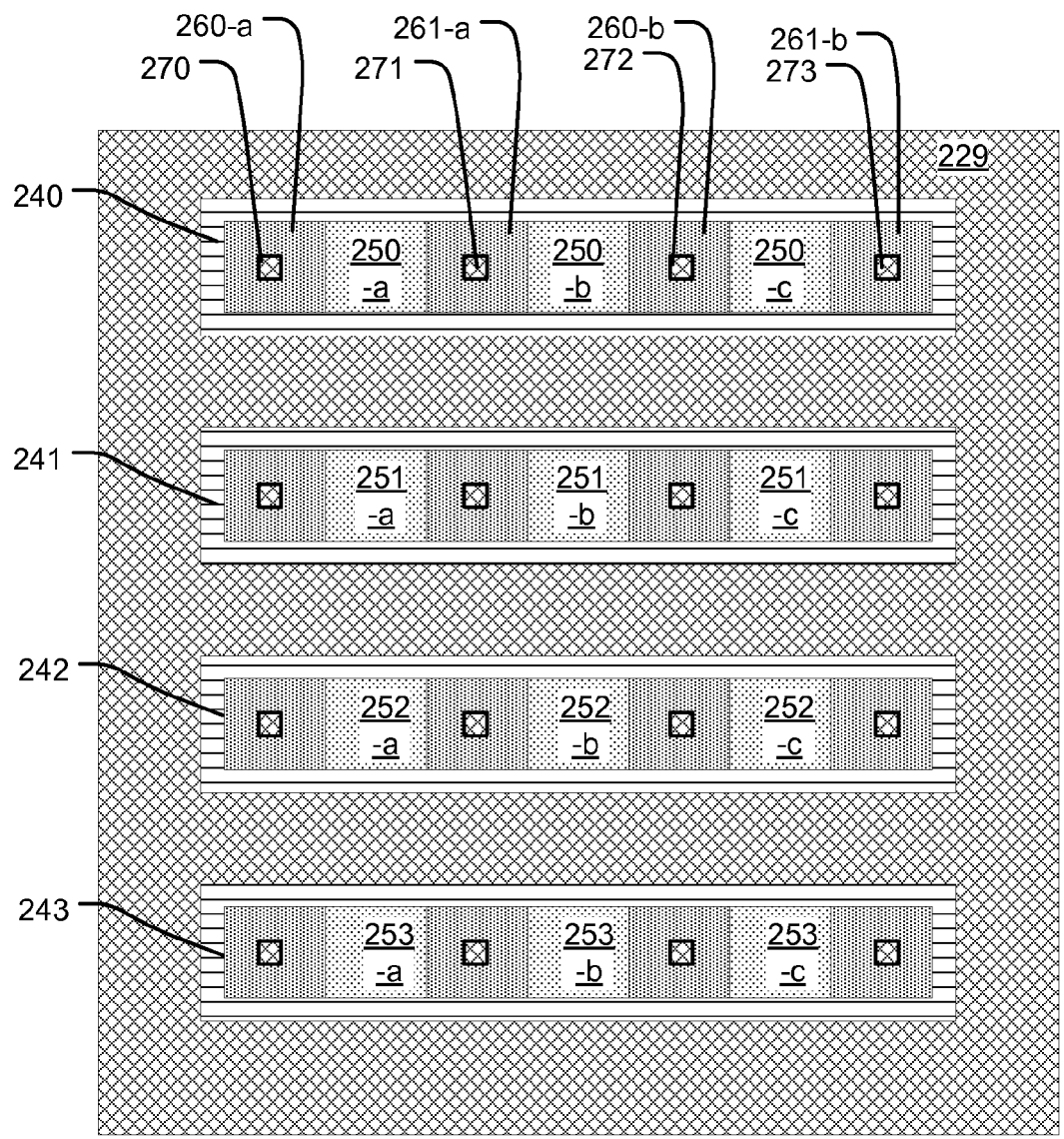

FIG. 12 shows a later stage after depositing the bit line material, such as n-type polysilicon, within the opening to form bit line pillars 260-a, 260-b coupled to the bottom bit line conductors and bit line pillars 261-a, 261-b coupled to the top of bit line conductors. In one process, n-type polysilicon is deposited using a conformal process to coat the sidewalls of the openings. Then, the resulting polysilicon-lined vias are filled with a tungsten plug (270-273) or other metal or silicide precursor material to improve the conductivity of the bit line pillars, and provide metal or metal silicide strapped bit line pillars. Use of strapped bit line pillars enables the formation of more levels in the 3D structure by reducing the resistance, and increasing the conductivity, of the bit line pillars. Next, the structure is planarized using a chemical mechanical polishing process or other planarizing technique to uncover the semiconductor body lines.

Figure 13:
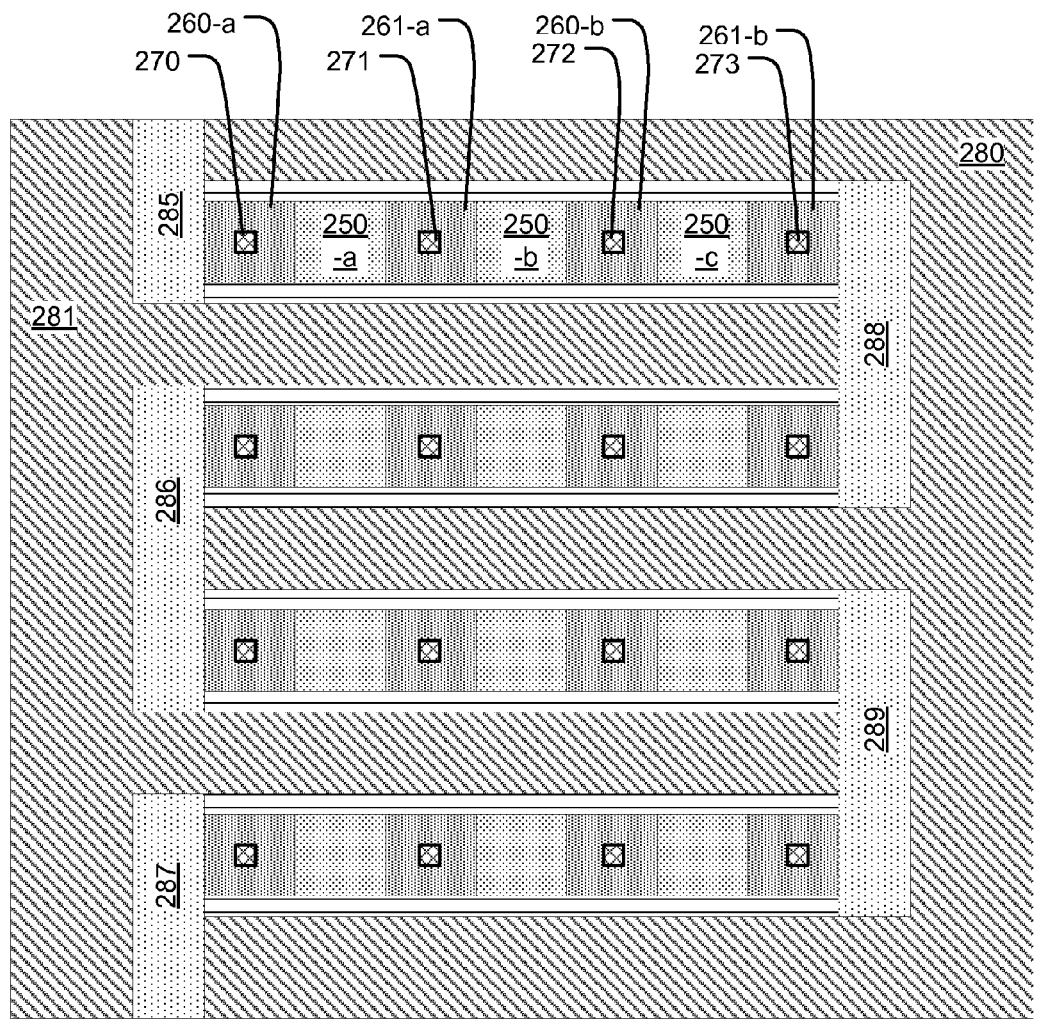

FIG. 13 illustrates a later stage after patterning of the left and right word line structures. The process includes etching through the multilayer stack and filling the resulting openings with insulating material 285-289 to create interleaved left and right word line structures 281, 280, in all levels of the device.

Figure 14:
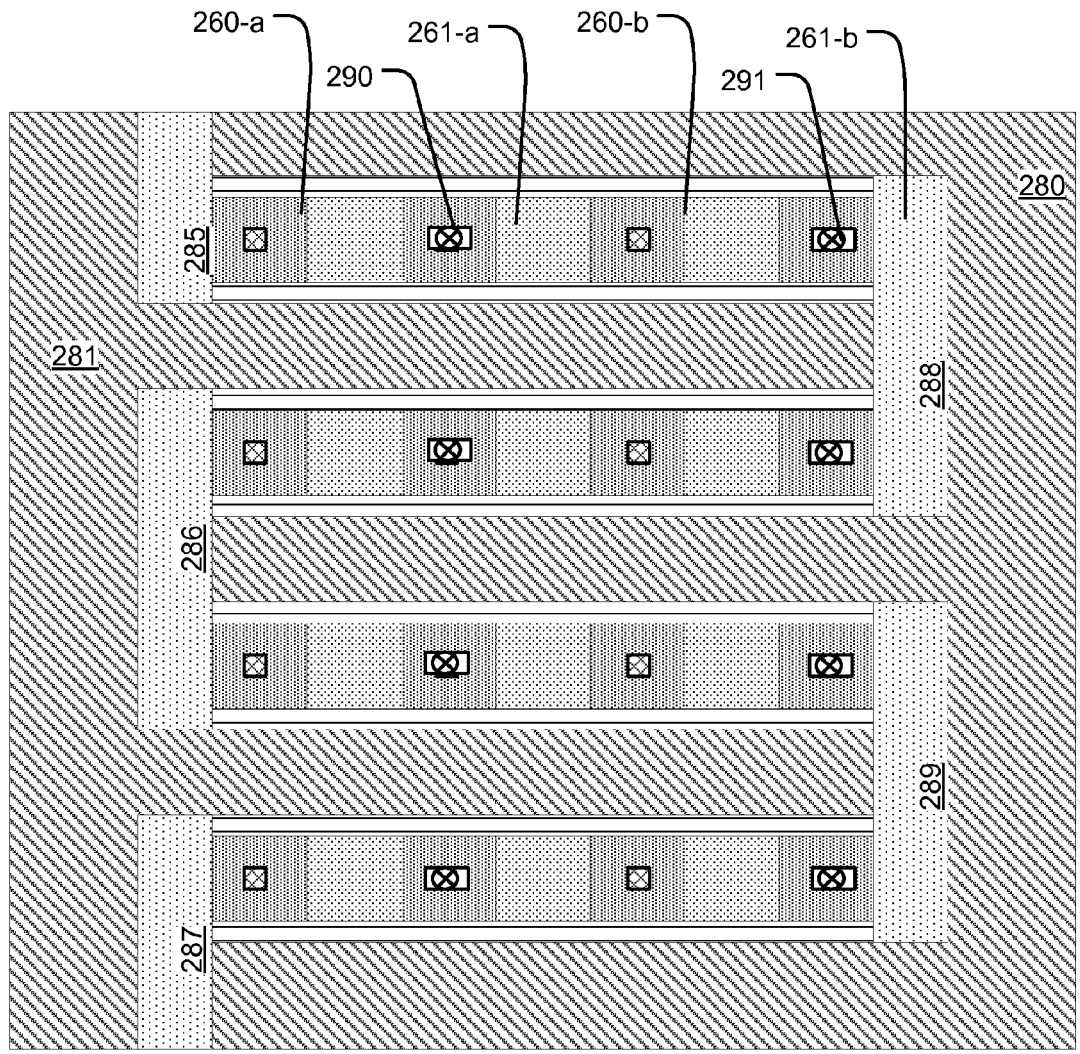
Figure 15:
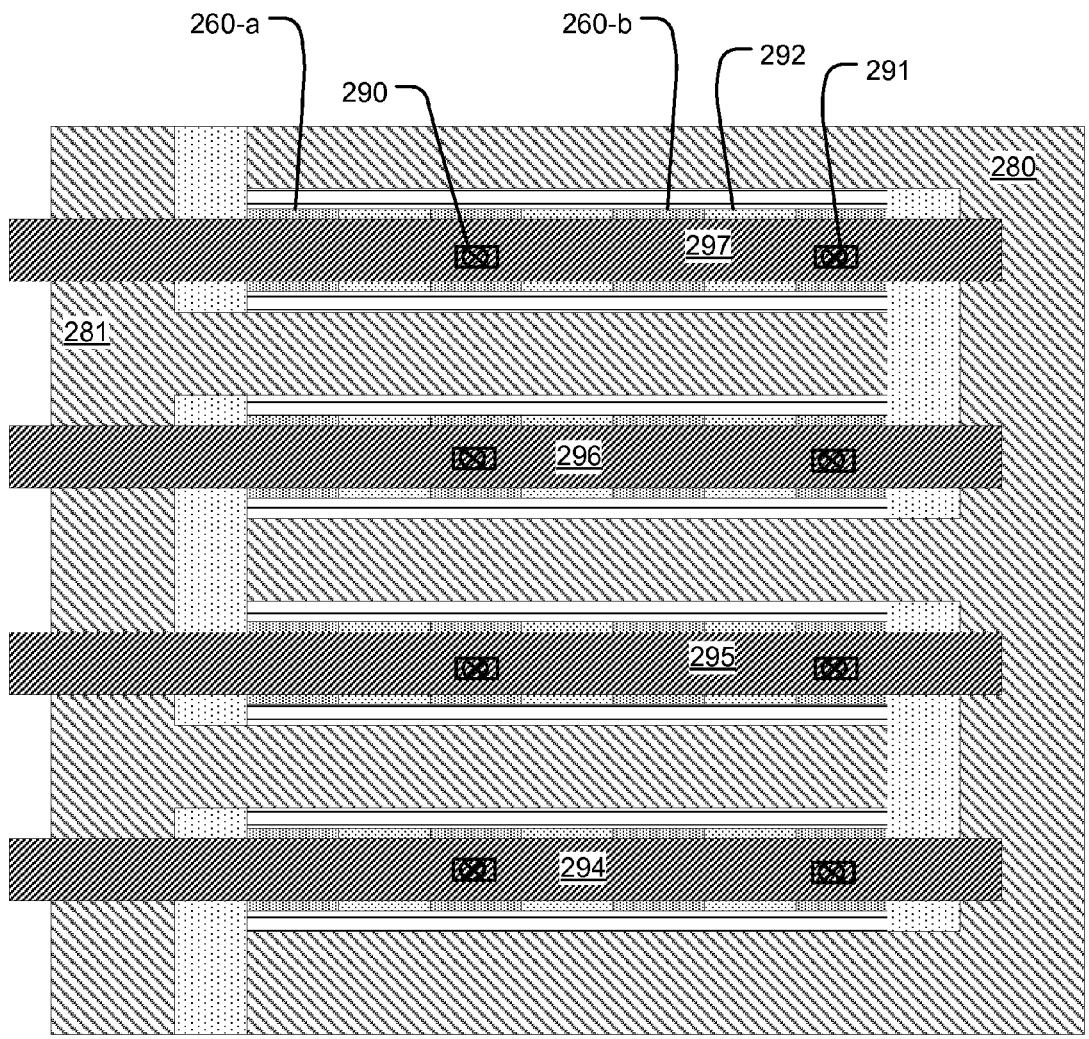

FIG. 14 illustrates a later stage in the process after formation of contacts 290, 291 extending upward through an insulating layer (not shown) for connection of the right side bit line pillars 261-a, 261-b to overlying bit line conductors arranged in the X-direction, without shorting the body line pillars (e.g. 290) and left side bit line pillars (e.g. 260-a, 260-b). As shown in FIG. 15, bit line conductors 294, 295, 296, 297 are patterned over the structure, extending in the X-direction parallel to the word line elements, for connection to a top bit line decoder, the top bit line conductors connect to the contacts (e.g. 290, 291 shown in outline to indicate that they are beneath the bit line conductors) formed at the top of the right side bit line pillars as described above with reference to FIG. 14.

Figure 16:
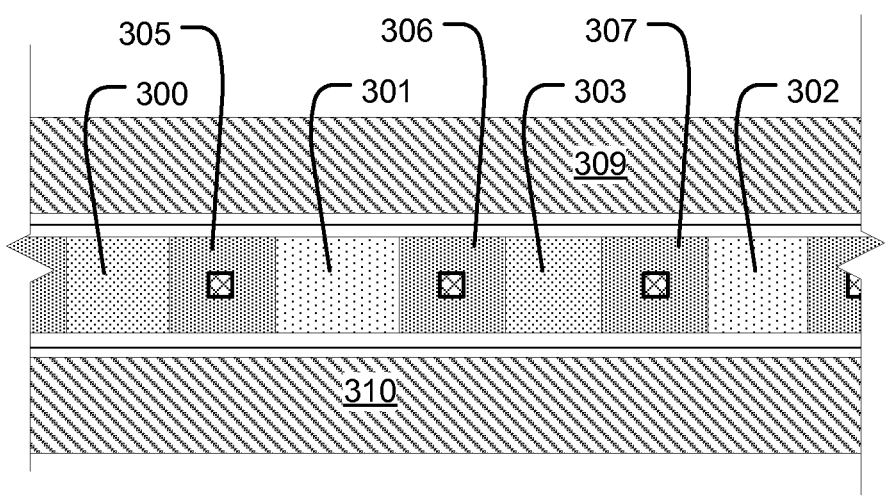
FIG. 16 illustrates an alternative implementation of the row of semiconductor bit line pillars and semiconductor body pillars, having insulating members separating unit source-channel-drain sets.

FIG. 16 illustrates an alternative arrangement, in which the rows of semiconductor pillars (e.g. between left and right word line elements 309, 310) used for the semiconductor body pillars and semiconductor bit line pillars are configured in a unit set including a first bit line pillar 306, a semiconductor body pillar 303, a second bit line pillar 307, and a pillar of insulating material 302. This unit is repeated along the row (insulating pillar 301 and bit line pillar 305 are part of a preceding unit set), so that the individual source-channel-drain units are electrically isolated. This results in insulating pillars (e.g. 301) in the trenches, between a bit line pillar (e.g. 305) on the second opposing side of a first semiconductor body pillar (e.g. 300) and a bit line pillar (e.g. 306) on the first opposing side of a second semiconductor body pillar (e.g. 303). This will improve the disturb performance of the array. The structure of FIG. 16 can be made using one extra lithographic step, in addition to the process of FIGS. 6-15, to define the insulating pillars, or can share the lithographic step used to form the left and right side word line elements described above with reference to FIG. 13.

Figure 17:
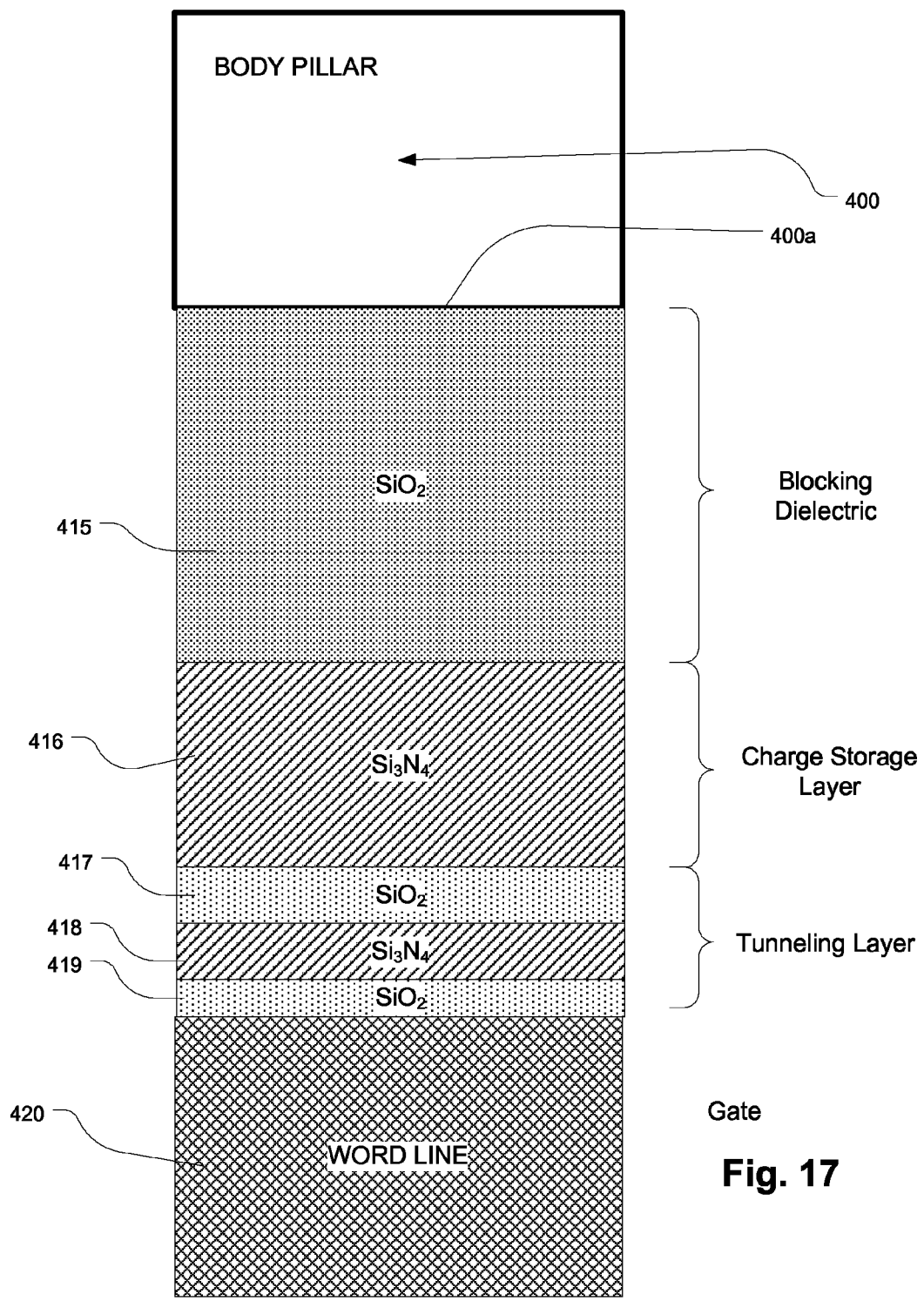
FIG. 17 illustrates a BE-SONOS charge storage structure utilized in an embodiment of the 3D memory structure described herein.

FIG. 17 is a simplified diagram of a charge storage structure suitable for use in the memory cells described herein, employing a bandgap engineered dielectric tunneling layer (BE-SONOS-type). The memory cell includes a channel surface 400a in a semiconductor body pillar 400. Not shown in FIG. 17 are a source in a first adjacent bit line pillar and a drain in a second adjacent bit line pillar.

A gate 420 in this embodiment comprises n+ polysilicon. P+ polysilicon may also be used. Other embodiments employ metals, metal compounds or combinations of metals and metal compounds for the gate 420, such as platinum, tantalum nitride, metal silicides, aluminum or other metal or metal compound gate materials. For some applications, it is preferable to use materials having work functions higher than 4.5 eV. A variety of high work function materials suitable for use as a gate terminal are described in U.S. Pat. No. 6,912,163, referred to above. Such materials are typically deposited using sputtering and physical vapor deposition technologies, and can be patterned using reactive ion etching.

In the embodiment illustrated in FIG. 17, the dielectric tunneling layer on the gate side comprises a composite of materials, including a first layer 419, referred to as a hole tunneling layer, of silicon dioxide on the surface of the gate 420 formed for example using in-situ steam generation ISSG with optional nitridation by either a post deposition NO anneal or by addition of NO to the ambient during deposition. The thickness of the first layer 419 of silicon dioxide is less than 2 nm, and preferably 1.5 nm or less.

A second layer 418, referred to as a band offset layer, of silicon nitride lies on the first layer 419 of silicon oxide formed for example using low-pressure chemical vapor deposition LPCVD, using for example dichlorosilane DCS and NH$_3$ precursors at 680° C. In alternative processes, the band offset layer comprises silicon oxynitride, made using a similar process with an N₂O precursor. The thickness of the layer 418 of silicon nitride is less than 3 nm, and preferably 2.5 nm or less.

A third layer 417 of silicon dioxide, referred to as an isolation layer, lies on the layer 418 of silicon nitride formed for example using LPCVD high temperature oxide HTO deposition. The layer 417 may also be implemented using silicon oxynitride, or other suitable material having a relatively large bandgap. The thickness of the layer 417 is less than 4 nm, and preferably 3.5 nm or less.

A charge trapping layer 416 in this embodiment comprises silicon nitride having a thickness greater than 5 nm, including for example about 7 nm in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on.

A blocking dielectric layer 415 in this embodiment comprises silicon oxide, which can be formed by wet conversion from the nitride by a wet furnace oxidation process. Other embodiments may be implemented using high temperature oxide (HTO) or LPCVD $SiO_2$. The thickness of layer 415 of silicon oxide can be for example in the range of about 5 to 8 nanometers, while the thickness of the layer 416 of silicon nitride can be for example in the range of 5 to 7 nanometers. The layer 415 of silicon oxide in one example is about 7 nm. Alternatively, other materials such as high-κ metal oxides like aluminum oxide, hafnium oxide and so on, or combinations of materials, can be used for the blocking dielectric layer 415.

In a representative embodiment, the first layer 419 can be 1.3 nm of silicon dioxide; the band offset layer 418 can be 2 nm of silicon nitride; the isolation layer 417 can be 2.5 nm of silicon dioxide; the charge trapping layer 416 can be 7 nm of silicon nitride; and the blocking dielectric layer 415 can be 7 nm of silicon oxide. The gate material can be p+ polysilicon.

The stack of layers 419-417 of FIG. 17 under a low electric field, has a "U-shaped" conduction band and an "inverted U-shaped" valence band. The dielectric tunneling layer described herein therefore is characterized by band offset characteristics, include a relatively large hole tunneling barrier height in a thin region (first layer 419) at the interface with the semiconductor body, and an increase in valence band energy level at a first offset less than 2 nm from the channel surface. The band offset characteristics also include a decrease in valence band energy level at a second offset (second layer 418) from the channel by providing a thin layer of relatively high tunneling barrier height material (third layer 417), resulting in the inverted U-shaped valence band shape. Likewise, the conduction band has a U-shape caused by the same selection of materials.

The valence band energy level at the first location is such that an electric field sufficient to induce hole tunneling through the thin region between the interface with the semiconductor body and the first location, is also sufficient to raise the valence band energy level after the first location to a level that effectively eliminates the hole tunneling barrier in the composite tunneling dielectric after the first location. This structure enables electric field assisted hole tunneling at high speeds while effectively preventing charge leakage through the composite tunneling dielectric in the absence of electric fields or in the presence of smaller electric fields induced for the purpose of other operations, such as reading data from the cell or programming adjacent cells.

Figure 18:
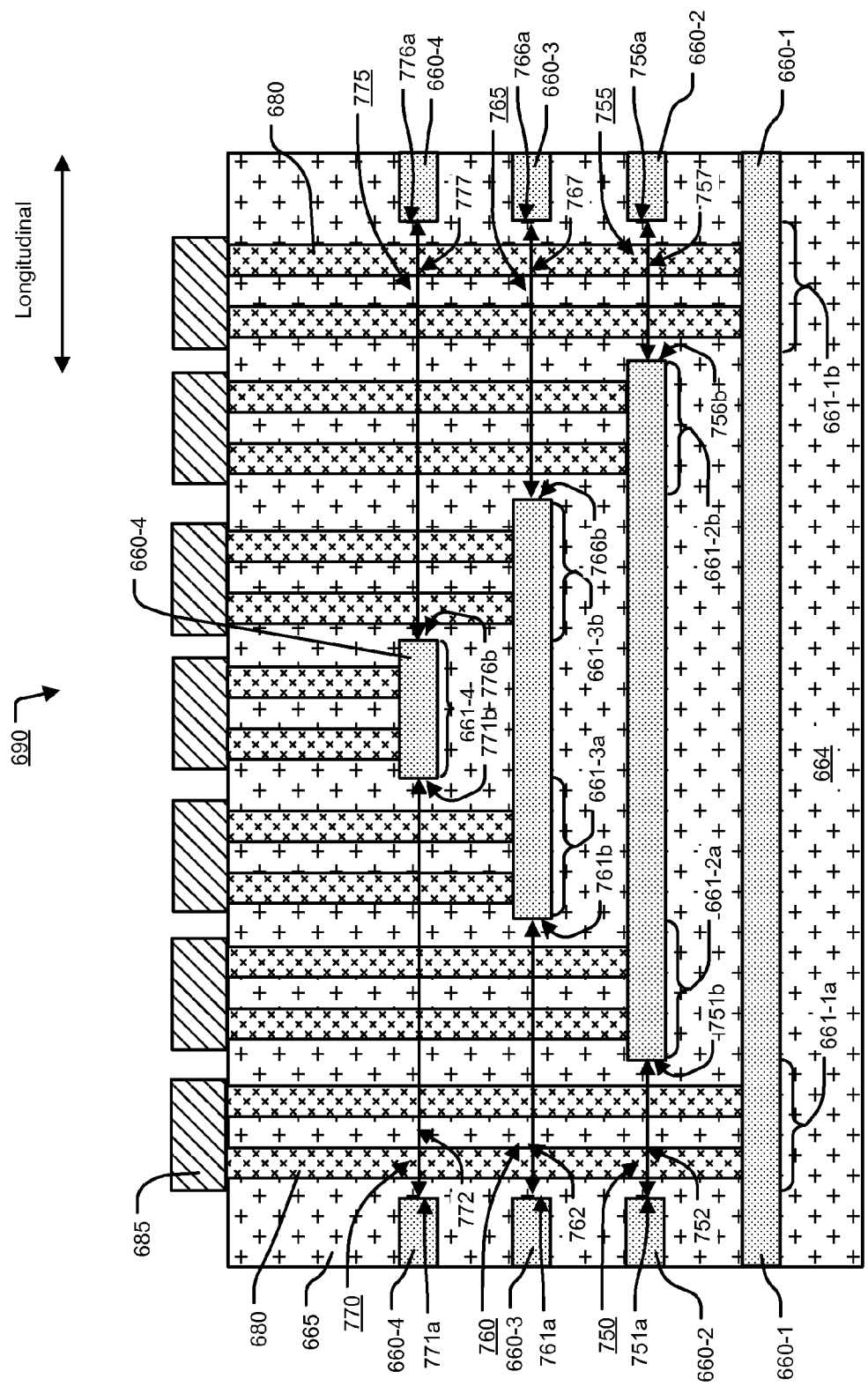
FIG. 18 and FIGS. 19A-19D illustrate a 3D interconnect structure for coupling the word line levels to decoding circuitry.

FIG. 18 illustrates a cross-sectional view of a suitable three-dimensional structure having an interconnect structure 690 where conductors 680 extend to landing areas on the word line structures in various levels 660-1 to 660-4 in the device. In the illustrated example four levels 660-1 to 660-4 are shown. The conductors 680 are arranged within the interconnect structure 690 to contact landing areas on the various levels 660-1 to 660-4. The conductors 680 for each particular level extend through openings in the overlying levels to contact the landing areas 661-1a, 661-1b, 661-2a, 661-2b, 661-3a, 661-3b, 661-4. The conductors 680 are used in this example for coupling the levels to interconnect lines 685 in a wiring layer (not shown) overlying the levels 660-1 to 660-4, and through the wiring layer to decoders in the substrate.

The landing areas are the portions of levels 660-1 to 660-4 used for contact with conductors 680. The sizes of the landing areas are large enough to provide room for the conductors 680 to adequately couple the levels 660-1 to 660-4 to the overlying interconnect lines 685, as well as to address issues such as misalignment between the conductors 680 and the overlying openings in one level for landing areas in different levels.

The size of a landing area thus depends on a number of factors, including the size and number of conductors used, and will vary from embodiment to embodiment. In addition, the number of the conductors 680 can be different for each of the landing areas.

In the illustrated example the levels 660-1 to 660-4 consist of respective planar word line structures as described above, with layers of insulating material 665 separating the levels 660-1 to 660-4.

The conductors 680 contacting the different levels 660-1 to 660-4 are arranged in a direction extending along the cross-section illustrated in FIG. 18. This direction defined by the arrangement of the conductors 680 contacting different levels 660-1 to 660-4 is referred to herein as the "longitudinal" direction. The "transverse" direction is perpendicular to the longitudinal direction, and is into and out of the cross-section illustrated in FIG. 1. Both the longitudinal and transverse directions are considered to be "lateral dimensions", meaning a direction that is in a 2-dimensional area of a plan view of the levels 660-1 to 660-4. The "length" of structures or features is its length in the longitudinal direction, and its "width" is its width in the transverse direction.

Level 660-1 is the lowest level in the plurality of levels 660-1 to 660-4. The level 660-1 is on insulating layer 664.

The level 660-1 includes first and second landing areas 661-1a, 661-1b for contact with conductors 680.

In FIG. 18 the level 660-1 includes two landing areas 661-1a, 661-1b on opposite ends of the interconnect structure 690. In some alternative embodiments one of the landing areas 661-1a, 661-1b is omitted.

Figure 19A:
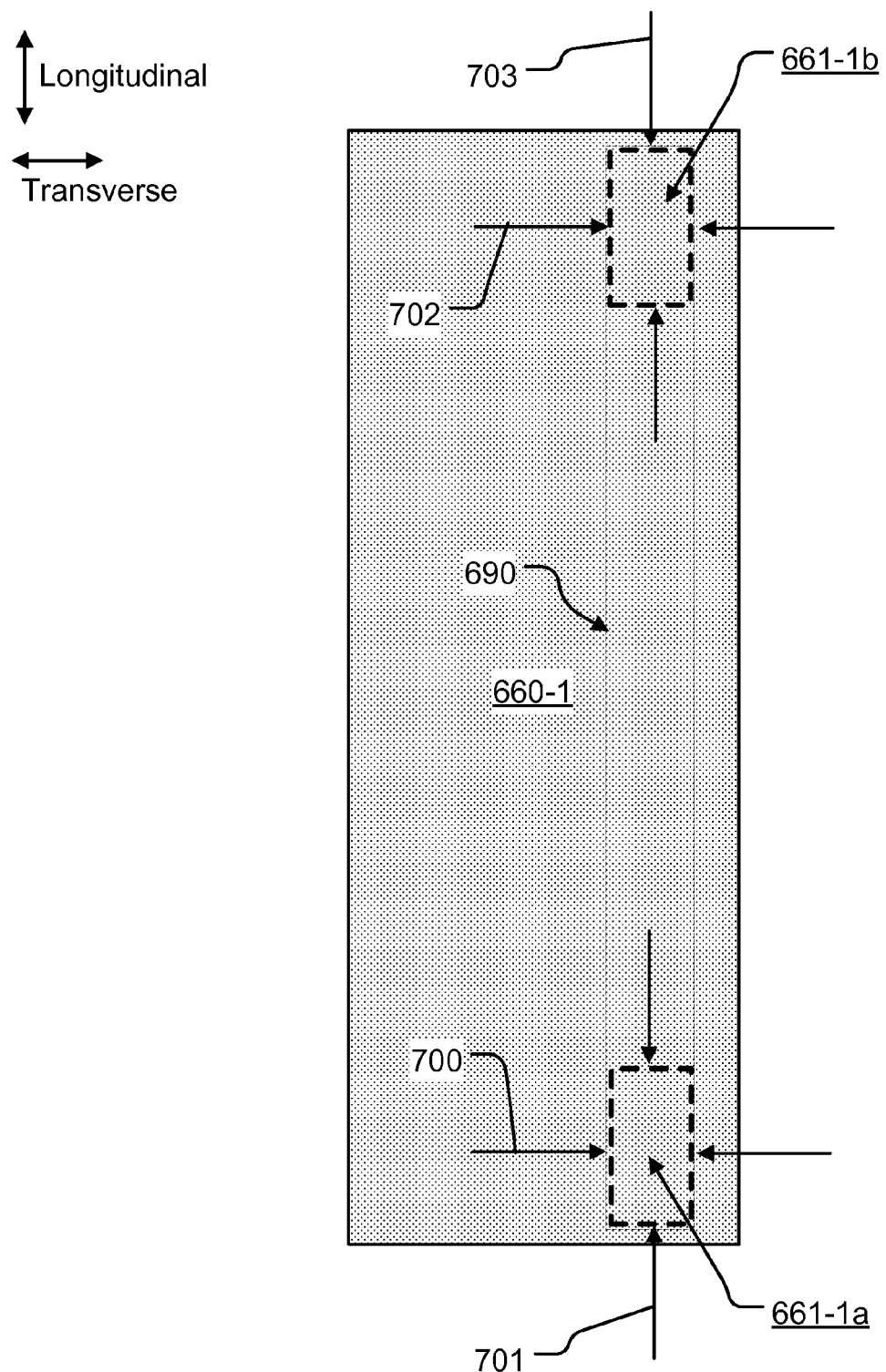

FIG. 19A is a plan view of a portion of level 660-1, including the landing areas 661-1a, 661-1b within the footprint of the interconnect structure 690. The footprint of the interconnect structure 690 can be close to the width of the via size for the conductors, and have a length that can be much longer than the width. As shown in FIG. 19A, landing area 661-1a has a width 700 in the transverse direction and a length 701 in the longitudinal direction. Landing area 661-1b has a width 702 in the transverse direction and a length 703 in the longitudinal direction. In the embodiment of FIG. 19A the landing areas 661-1a, 661-1b each have a rectangular cross-section. In embodiments, the landing areas 661-1a, 661-1b may each have a cross-section that is circular, elliptical, square, rectangular, or somewhat irregularly shaped.

Because level 660-1 is the lowest level, the conductors 680 need not pass through the level 660-1 to underlying levels. Thus, in this example level 660-1 does not have openings within the interconnect structure 690.

Referring back to FIG. 18, level 660-2 overlies level 660-1. Level 660-2 includes an opening 750 overlying the landing area 661-1*a* on level 660-1. The opening 750 has a distal longitudinal sidewall 751*a* and a proximal longitudinal sidewall 751*b* defining the length 752 of the opening 750. The length 752 of the opening 750 is at least as large as the length 701 of the underlying landing area 661-1*a*, so that the conductors 680 for the landing area 661-1*a* can pass through the level 660-2.

The level 660-2 also includes opening 755 overlying the landing area 661-1*b*. The opening 755 has distal and proximal longitudinal sidewalls 756*a*, 756*b* defining the length 757 of the opening 755. The length 757 of the opening 755 is at least as large as the length 703 of the underlying landing area 661-1*b*, so that the conductors 680 for the landing area 661-1*b* can pass through the level 660-2.

The level 660-2 also includes first and second landing areas 661-2*a*, 661-2*b* adjacent the openings 750, 755 respectively. The first and second landing areas 661-2*a*, 661-2*b* are the portions of level 660-2 used for contact with the conductors 680.

Figure 19B:
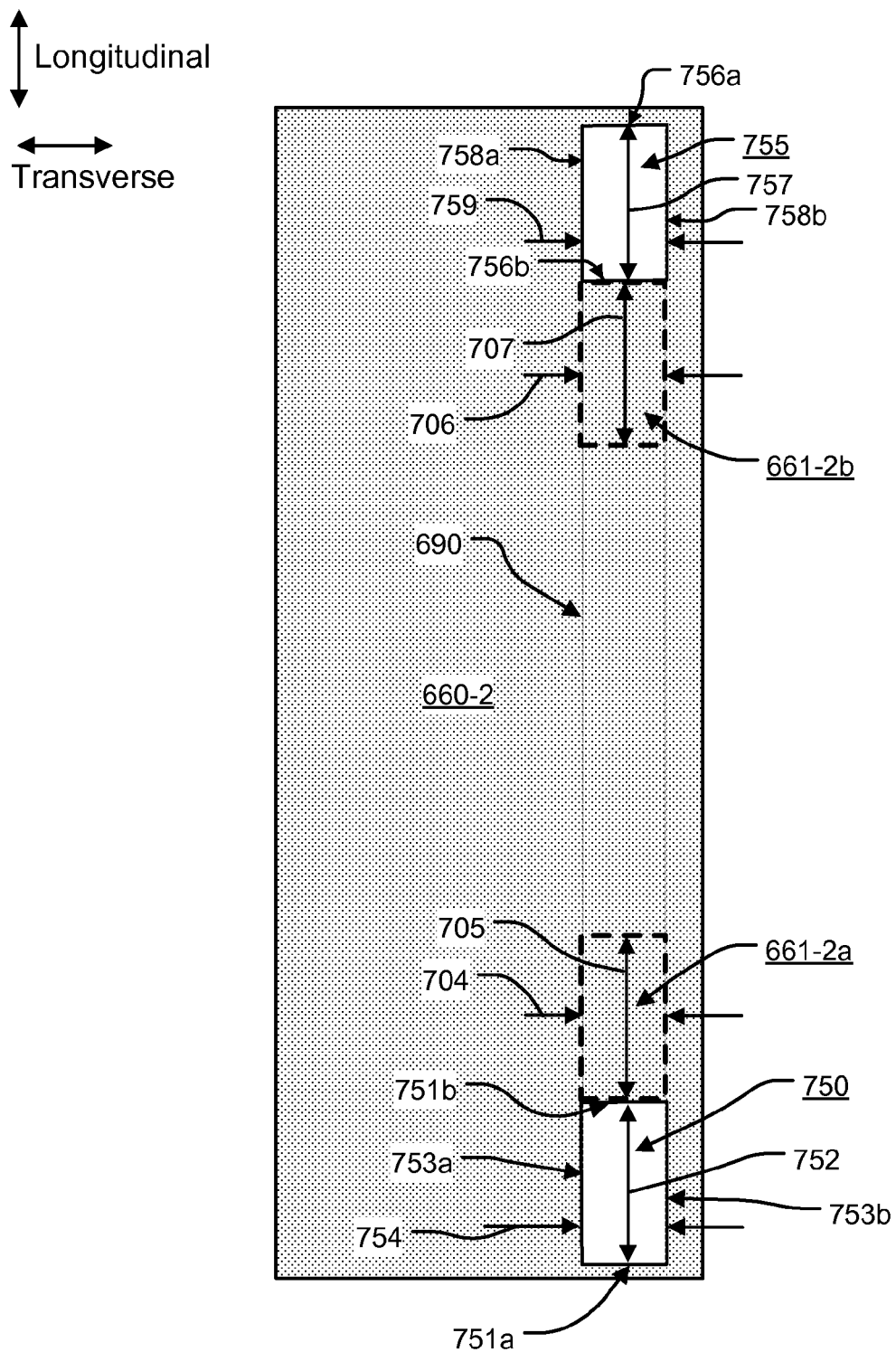

FIG. 19B is a plan view of a portion of level 660-2, including the first and second landing areas 661-2*a*, 661-2*b* and the openings 750, 755 within the interconnect structure 690.

As shown in FIG. 19B, opening 750 has longitudinal sidewalls 751*a*, 751*b* defining the length 752, and has transverse sidewalls 753*a*, 753*b* defining the width 754 of the opening 750. The width 754 is at least as large as the width 700 of the underlying landing area 661-1*a*, so that the conductors 680 can pass through the opening 750.

Opening 755 has longitudinal sidewalls 756*a*, 756*b* defining the length 757, and has transverse sidewalls 758*a*, 758*b* defining the width 759. The width 759 is at least as large as the width 702 of the underlying landing area 661-1*b*, so that the conductors 680 can pass through the opening 755.

As shown in FIG. 19B, landing area 661-2*a* is adjacent the opening 750 and has a width 704 in the transverse direction and a length 705 in the longitudinal direction. Landing area 661-2*b* is adjacent the opening 755 and has a width 706 in the transverse direction and a length 707 in the longitudinal direction.

Referring back to FIG. 18, level 660-3 overlies level 660-2. Level 660-3 includes an opening 760 overlying landing area 661-1*a* on level 660-1 and landing area 661-2*a* on level 660-2. The opening 760 has distal and proximal longitudinal sidewalls 761*a*, 761*b* defining the length 762 of the opening 760. The length 762 of the opening 760 is at least as large as the sum of the lengths 701 and 705 of the underlying landing areas 661-1*a* and 661-2*a*, so that the conductors 680 for the landing areas 661-1*a* and 661-2*a* can pass through the level 660-3.

As can be seen in FIG. 18, the distal longitudinal sidewall 761*a* of opening 760 is vertically aligned with the distal longitudinal sidewall 751*a* of the underlying opening 750. In the manufacturing embodiment described in more detail below, the openings can be formed using the opening in a single etch mask and one additional mask formed over the opening in the single etch mask, as well as processes for etching the addition mask without a critical alignment step, resulting in the formation of openings having distal longitudinal sidewalls (761*a*, 751*a*, . . . ) along the perimeter of the single etch mask that are vertically aligned.

The level 660-3 also includes opening 765 overlying the landing area 661-1*b* on level 660-1 and landing area 661-2*b* on level 660-2. The opening 765 has outside and inside longitudinal sidewalls 766*a*, 766*b* defining the length 767 of the opening 765. The outside longitudinal sidewall 766*a* of opening 765 is vertically aligned with the outside longitudinal sidewall 756*a* of the underlying opening 755.

The length 767 of the opening 765 is at least as large as sum of the lengths 703 and 707 of the underlying landing areas 661-1*b* and 661-2*b*, so that the conductors 680 for the landing areas 661-1*b* and 661-2*b* can pass through the level 660-3.

The level 660-3 also includes first and second landing areas 661-3*a*, 661-3*b* adjacent the openings 760, 765 respectively. The first and second landing areas 661-3*a*, 661-3*b* are the portions of level 660-3 used for contact with the conductors 680.

Figure 19C:
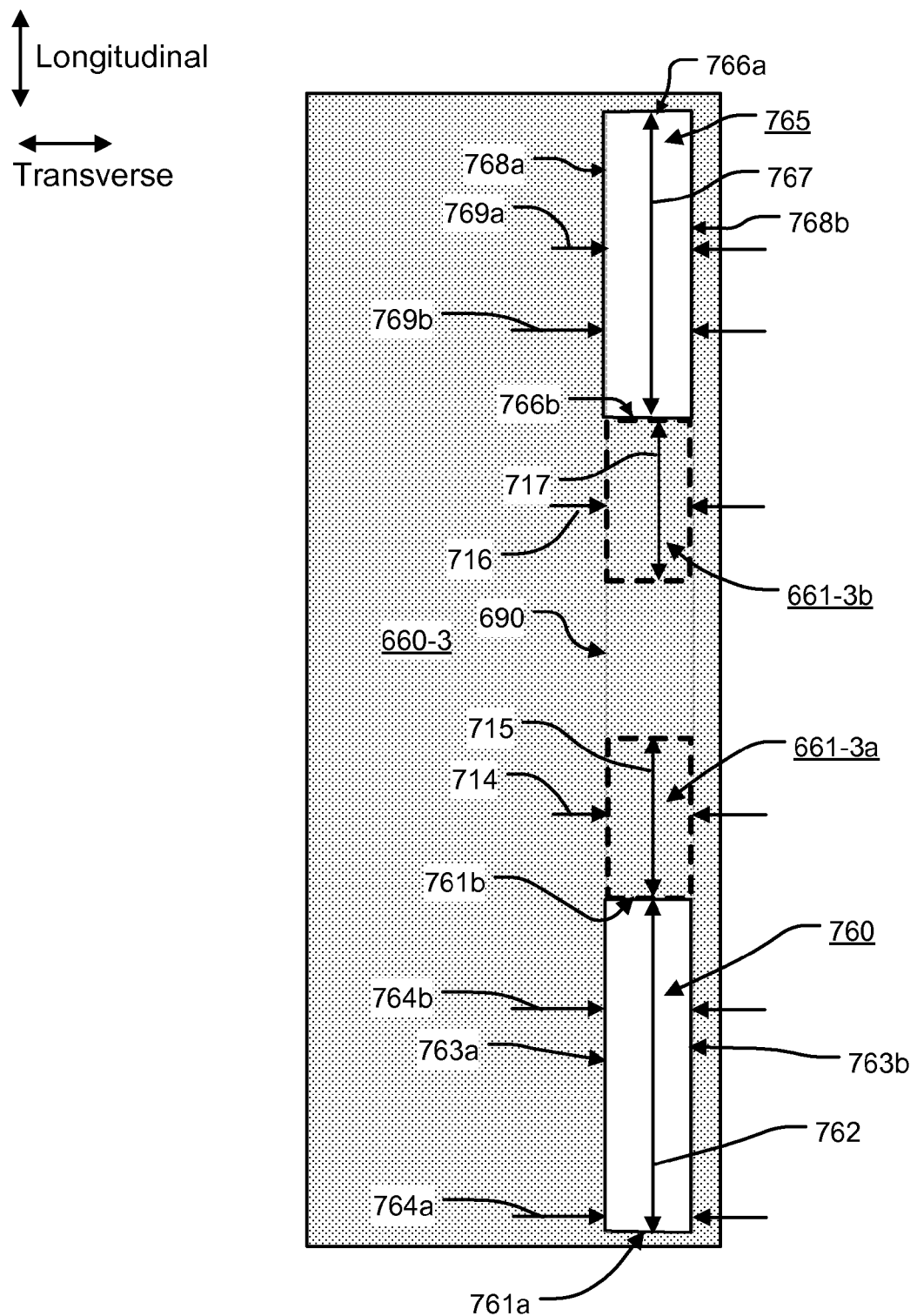

FIG. 19C is a plan view of a portion of level 660-3, including the first and second landing areas 661-3*a*, 661-3*b* and the openings 760, 765 within the interconnect structure 690.

As shown in FIG. 19C, opening 760 has outside and inside longitudinal sidewalls 761*a*, 761*b* defining the length 762, and has transverse sidewalls 763*a*, 763*b* defining the width 764*a*, 764*b* of the opening 760. The width 764*a* is at least as large as the width 700 of the underlying landing area 661-1*a*, and width 764*b* is at least as large as the width 704 of the underlying landing area 661-2*a*, so that the conductors 680 can pass through the opening 760.

In the illustrated embodiments, widths 764*a* and 764*b* are substantially the same. Alternatively, the widths 764*a* and 764*b* can be different, in order to accommodate landing areas having different widths.

Opening 765 has longitudinal sidewalls 766*a*, 766*b* defining the length 767, and has transverse sidewalls 768*a*, 768*b* defining the width 769. The width 769*a* is at least as large as the width 702 of the underlying landing area 661-1*b*, and the widths 769*a*, 769*b* is at least as large as the width 706 of the underling landing area 661-2*b*, so that the conductors 680 can pass through the opening 765.

As shown in FIG. 19C, landing area 661-3*a* is adjacent the opening 760 and has a width 714 in the transverse direction and a length 715 in the longitudinal direction. Landing area 661-3*b* is adjacent the opening 765 has a width 716 in the transverse direction and a length 717 in the longitudinal direction.

Referring back to FIG. 18, level 660-4 overlies level 660-3. Level 660-4 includes an opening 770 overlying the landing area 661-1*a* on level 660-1, the landing area 661-2*a* on level 660-2, and the landing area 661-3*a* on level 660-3. The opening 770 has longitudinal sidewalls 771*a*, 771*b* defining the length 772 of the opening 770. The length 772 of the opening 770 is at least as large as the sum of the lengths 701, 705, and 715 of the underlying landing areas 661-1*a*, 661-2*a*, 661-3*a* so that the conductors 680 for the landing areas 661-1*a*, 661-2*a*, 661-3*a* can pass through the level 660-4. As shown in FIG. 18, the longitudinal sidewall 771*a* of opening 770 is vertically aligned with the longitudinal sidewall 761*a* of the underlying opening 760.

The level 660-4 also includes opening 775 overlying the landing area 661-1*b* on level 660-1, the landing area 661-2*b* on level 660-2, and the landing area 661-3*b* on level 660-3. The opening 775 has longitudinal sidewalls 776*a*, 776*b* defining the length 777 of the opening 775. The longitudinal sidewall 776*a* of opening 775 is vertically aligned with the longitudinal sidewall 766*a* of the underlying opening 765.

The length 777 of the opening 775 is at least as large as sum of the lengths 703, 707, and 717 of the underlying landing areas 661-1*b*, 661-2*b* and 661-3*b*, so that the conductors 680 for the landing areas 661-1*b*, 661-2*b*, and 661-3*b* can pass through the level 660-4.

The level 660-4 also includes a landing area 661-4 between the openings 770, 775. The landing area 661-4 is the portion of level 660-4 used for contact with the conductors 680. In FIG. 18, the level 660-4 has one landing area 661-4. Alternatively, the level 660-4 may include more than one landing area.

Figure 19D:
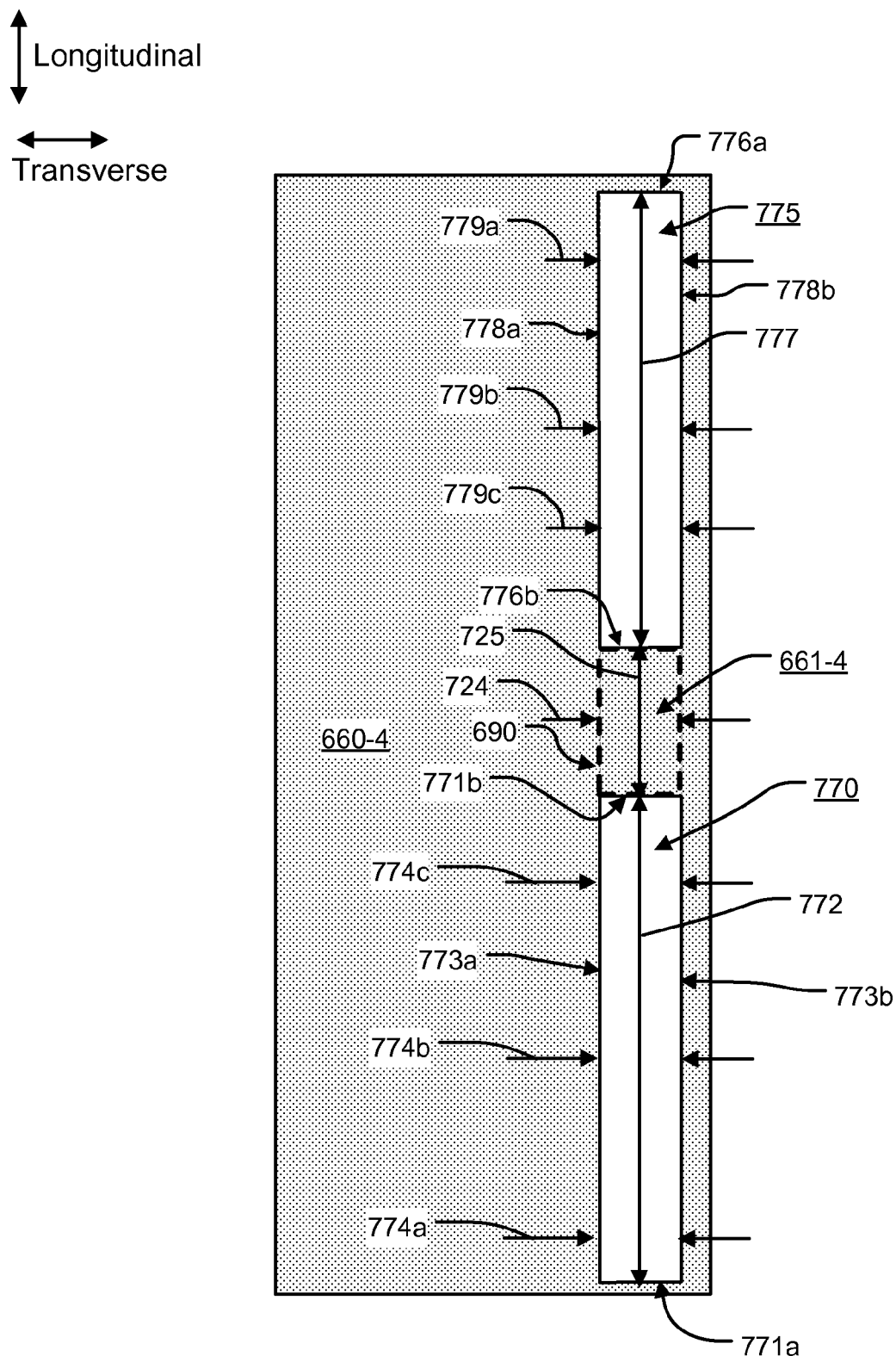

FIG. 19D is a plan view of a portion of level 660-4, including landing area 661-4 and the openings 770, 775 within the interconnect structure 690.

As shown in FIG. 19D, opening 770 has longitudinal sidewalls 771a, 771b defining the length 772, and has transverse sidewalls 773a, 773b defining the width 774 of the opening 770. The widths 774a, 774b, 774c are at least as large as the widths 700, 704, and 714 of the underlying landing areas 661-1a, 661-2a and 661-3a, so that the conductors 680 can pass through the opening 760.

Opening 775 has longitudinal sidewalls 776a, 776b defining the length 777, and has transverse sidewalls 778a, 778b defining the width 779. The widths 779a, 779b, 779c are at least as large as the widths 702, 706, and 716 of the underlying landing areas 661-1b, 661-2b and 661-3b, so that the conductors 680 can pass through the opening 775.

As shown in FIG. 19D, landing area 661-4 is between the openings 770, 775 and has a width 724 in the transverse direction and a length 725 in the longitudinal direction.

Referring back to FIG. 18, the distal longitudinal sidewalls 771a, 761a, and 751a of openings 770, 760, and 750 are vertically aligned, so that the difference in the length of the openings 770, 760, and 750 is due to the horizontal offset of the sidewalls 771b, 761b, and 751b. As used herein, elements or features "vertically aligned" are substantially flush with an imaginary plane perpendicular to both the transverse and longitudinal directions. As used herein, the term "substantially flush" is intended to accommodate manufacturing tolerances in the formation of the openings using the opening in a single etch mask and multiple etch processes which may cause variations in the planarity of the sidewalls.

As shown in FIG. 18, the longitudinal sidewalls 776a, 766a, and 756a of openings 775, 765, and 755 also are vertically aligned.

Similarly, the transverse sidewalls of the openings in the levels are also vertically aligned. Referring to FIGS. 19A-19D, the transverse sidewalls 773a, 763a, and 753a of openings 770, 760, and 750 are vertically aligned. In addition the transverse sidewalls 773b, 763b, and 753b are vertically aligned. For openings 775, 765, and 755 the transverse sidewalls (not shown) are vertically aligned, and the longitudinal sidewalls 776b, 766b, and 756b are vertically aligned.

In the illustrated embodiment, the openings in the various levels 660-1 to 660-4 have substantially the same width in the transverse direction. Alternatively, the width of the openings can vary along the longitudinal direction, for example in a step-like manner, in order to accommodate landing areas having different widths.

In the cross-section of FIG. 18, the openings within the interconnect structure 690 result in the levels having a staircase-like pattern on both sides of the landing area 661-4 on level 660-4. That is, the two openings in each level are symmetrical about an axis perpendicular to both the longitudinal and transverse directions, and the two landing areas of each level are also symmetrical about that axis. As used herein, the term "symmetrical" is intended to accommodate manufacturing tolerances in the formation of the openings using the opening in a single etch mask and multiple etch processes which may cause variations in the dimensions of the openings.

In alternative embodiments in which each level includes a single opening and a single landing area, the levels have a staircase-like pattern on only one side.

Figure 20:
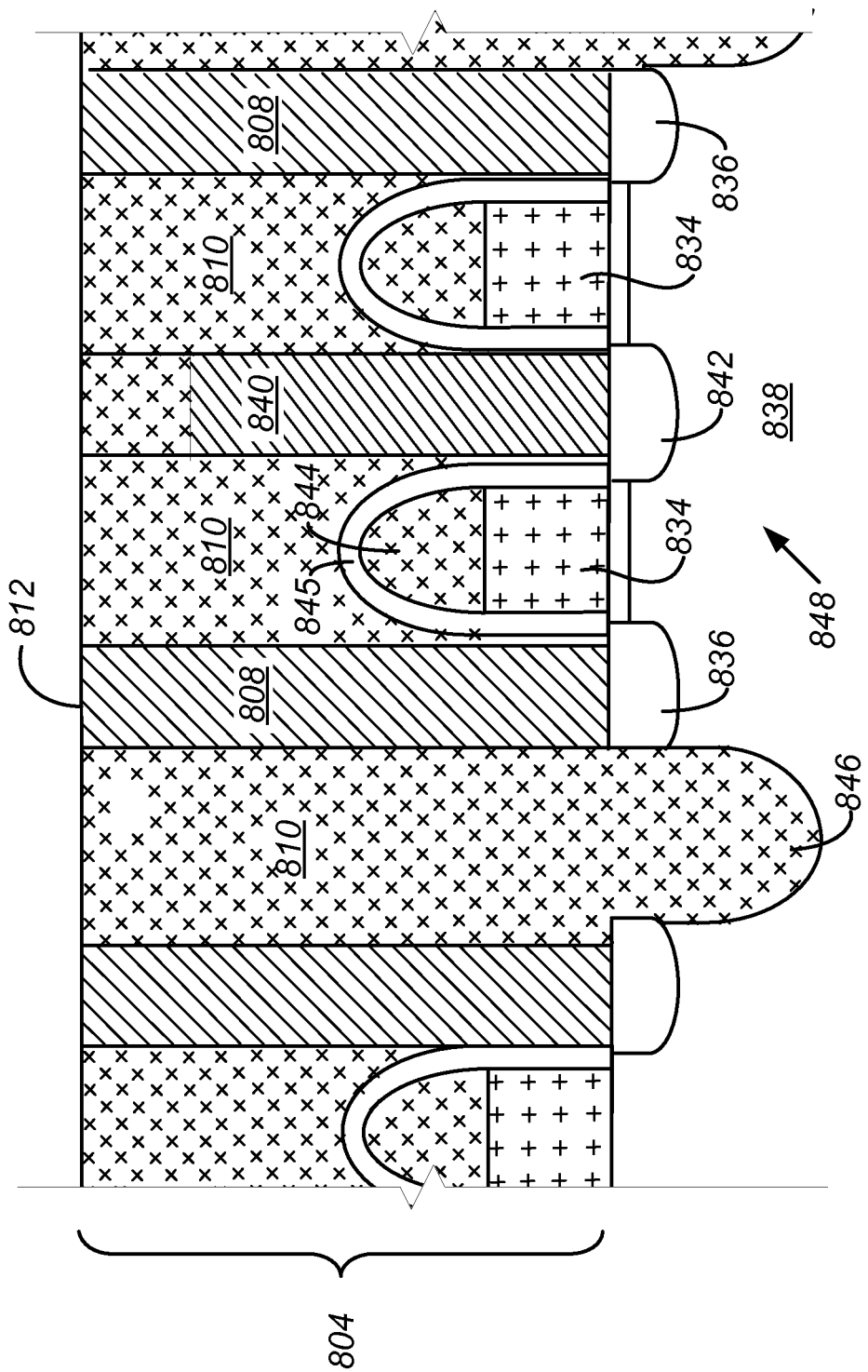
FIG. 20 illustrates implementation of a representative body line access device array in a substrate.

FIG. 20 shows one example implementation for an array of access devices suitable for use as the body line access device array shown in FIG. 1. As shown in FIG. 20, an access layer 804 is implemented in a substrate including insulating material 810, having a top surface with an array of contacts (e.g. contact 812) exposed thereon. The contacts for individual body pillars are provided at top surfaces of drain contacts 808, which are coupled to the drain terminals of MOS transistors in the access layer. The access layer 804 includes a semiconductor body having source regions 842 and drain regions 836 therein. Polysilicon word lines 834 are provided over gate dielectric layers and between the source regions 842 and drain regions 836. In the embodiment shown, the source regions 842 are shared by adjacent MOS transistors, making two-transistor structures 848. Source contacts 840 are positioned between word lines 834 and contact source regions 842 within substrate 838. The source contacts 840 can be connected to bit lines (not shown) in a metal layer, which run perpendicular to the word lines and between the columns of drain contacts 808. Word lines 834 are covered by silicide caps 844. Word lines 834 and caps 844 are covered by a dielectric layer 845. Isolation trenches 846 separate the two-transistor structures 848 from the adjacent two transistor structures. In this example transistors act as the access devices. Individual body pillars can be coupled to the contacts 812, and selected individually by controlling the biasing of the source contacts 840 and the word lines 834. Of course other structures may be used to implement the access device array, including for example, vertical MOS device arrays.

Figure 21:
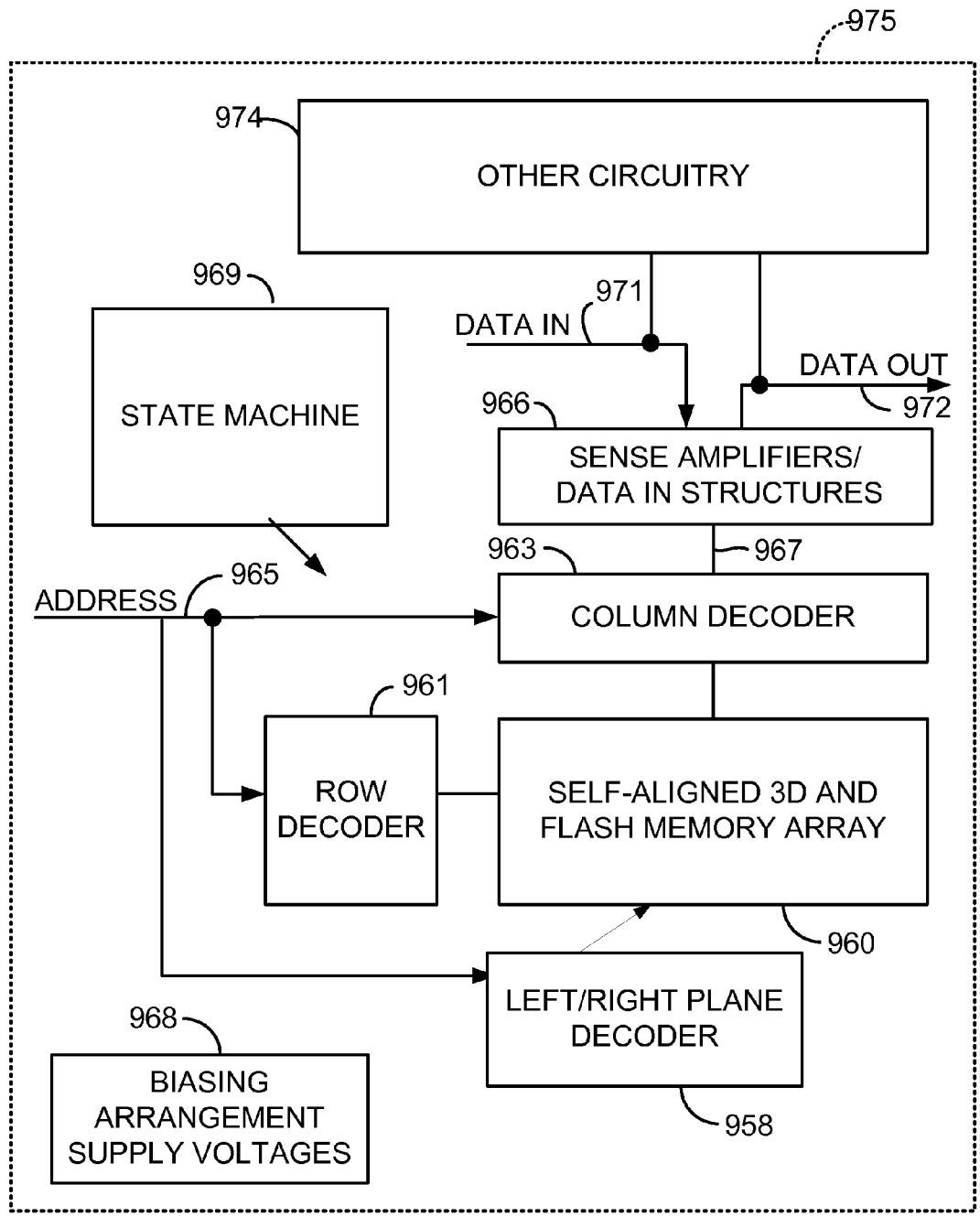
FIG. 21 is a simplified block diagram of an integrated circuit including a 3D AND-type charge trapping memory array.

FIG. 21 is a simplified block diagram of an integrated circuit according to an embodiment of the present invention. The integrated circuit line 975 includes a 3D AND flash memory array 960, implemented as described herein, on a semiconductor substrate. Addresses are supplied on bus 965 to column decoder 963, row decoder 961 and left/right plane decoder 958. An array of access devices for individual body lines underlies the array 960, and shares the row decoder 961 and column decoder 963, with the top and bottom bit lines in the array 960, for array embodiments like that shown in FIG. 1. Sense amplifiers and data-in structures in block 966 are coupled to the top bit lines and column decoder 963 in this example via data bus 967. Data is supplied via the data-in line 971 from input/output ports on the integrated circuit 975 or from other data sources internal or external to the integrated circuit 975, to the data-in structures in block 966. In the illustrated embodiment, other circuitry 974 is included on the integrated circuit, such as a general purpose processor or special purpose application circuitry, or a combination of modules providing system-on-a-chip functionality supported by the AND flash memory cell array. Data is supplied via the data-out line 972 from the sense amplifiers in block 966 to input/output ports on the integrated circuit 975, or to other data destinations internal or external to the integrated circuit 975.

A controller implemented in this example using bias arrangement state machine 969 controls the application of bias arrangement supply voltage generated or provided through the voltage supply or supplies in block 968, such as read, erase, program, erase verify and program verify voltages. The controller can be implemented using special-purpose logic circuitry as known in the art. In alternative embodiments, the controller comprises a general-purpose processor, which may be implemented on the same integrated circuit, which executes a computer program to control the operations of the device. In yet other embodiments, a combination of special-purpose logic circuitry and a general-purpose processor may be utilized for implementation of the controller.

Figure 22:
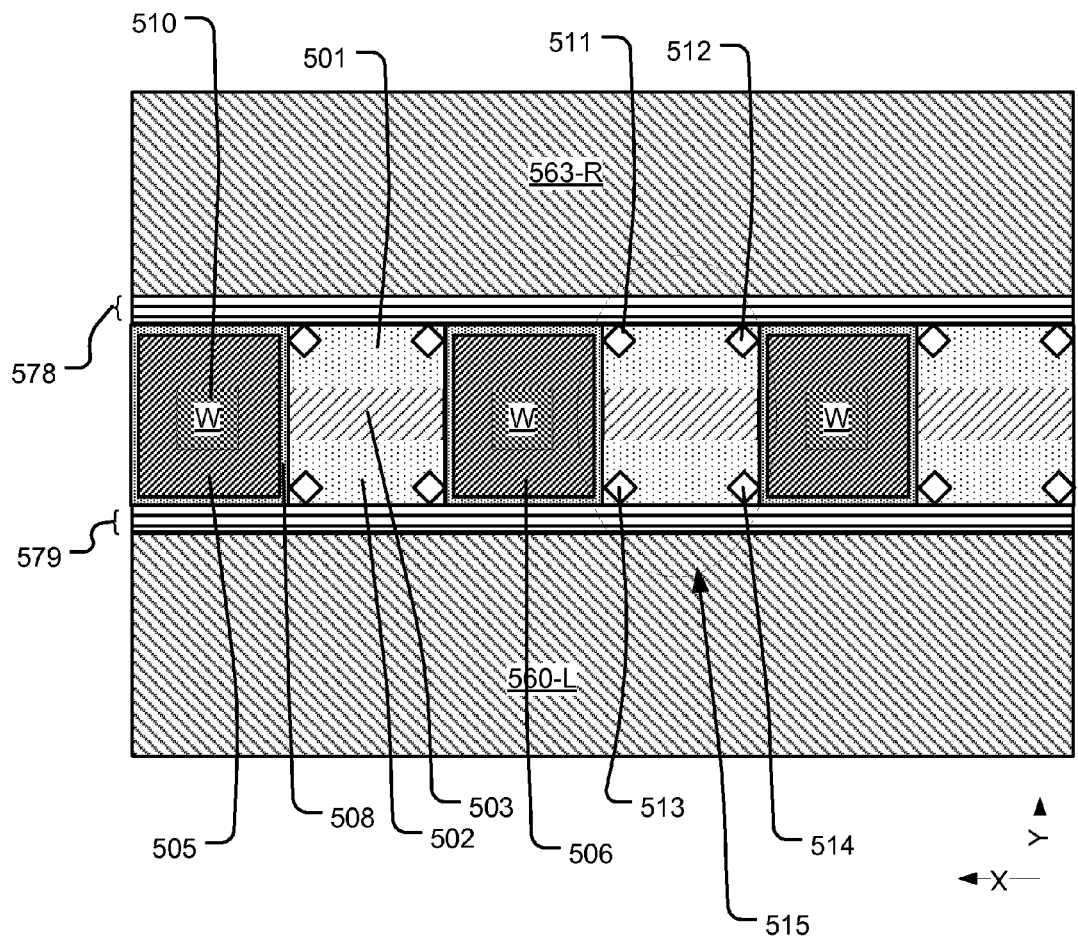
FIG. 22 illustrates an alternative embodiment of 2-cell structures which can be configured in 3 dimensions.

FIG. 22 illustrates an alternative embodiment of 2-cell structures which can be configured in 3 dimensions as described above. FIG. 22 shows a right side word line 563-R and a left side word line 560-L in an X-Y plane of the structure, like the perspective shown in FIG. 5. The semiconductor body pillars in the embodiment illustrated in FIG. 22 are multilayer structures. For example, a semiconductor body pillar includes a thin body layer 501 adjacent the dielectric charge trapping structure 578 on the right side and a thin body layer 502 adjacent the dielectric charge trapping structure 579 on the left side. The thin body layers 501, 502 can be implemented using amorphous silicon, which can be lightly p-type doped or intrinsic for example. An insulating dielectric layer 503 lies between the thin body layers 501 and 502, segregating the channel body regions and enabling the creation of higher electric fields to facilitate source side injection programming. The first and second bit line pillars in the embodiment shown in FIG. 22 include a silicide column 505, 506 with a metal core such as the tungsten core 510. A thin layer 508 of semiconductor, such as n-type silicon is formed so that it lies between the silicide columns 505, 506 and the channel body layers 501, 502. The silicide columns form a Schottky junction with the thin body layers (e.g. 501, 502).

The structure shown in FIG. 22 can be used for storing data in 2 charge trapping sites per cell. Thus, charge trapping sites 511 and 512 can be used in one cell of a 2-cell structure 515 and the charge trapping sites 513 and 514 can be used in the other cell of the 2-cell structure 515.

The structure shown in FIG. 22 is adapted for programming using source side injection, and enables the use of two charge storage sites per cell. For example, a source side injection could be induced by biasing a source side bit line to ground, biasing the drain side bit line to about negative 4 volts, and biasing the selected word line at about negative 7 volts. Also, the structure shown FIG. 22 is adapted for erasing by hot hole injection. For example, hot hole injection could be induced by biasing the source side and drain side bit lines to about 5 volts, then biasing the selected word line to about negative 7 volts. Alternatively, Fowler Nordheim erase could be implemented by biasing the gate to about negative 14 volts and grounding the bit lines and the channel region.

Figure 23:
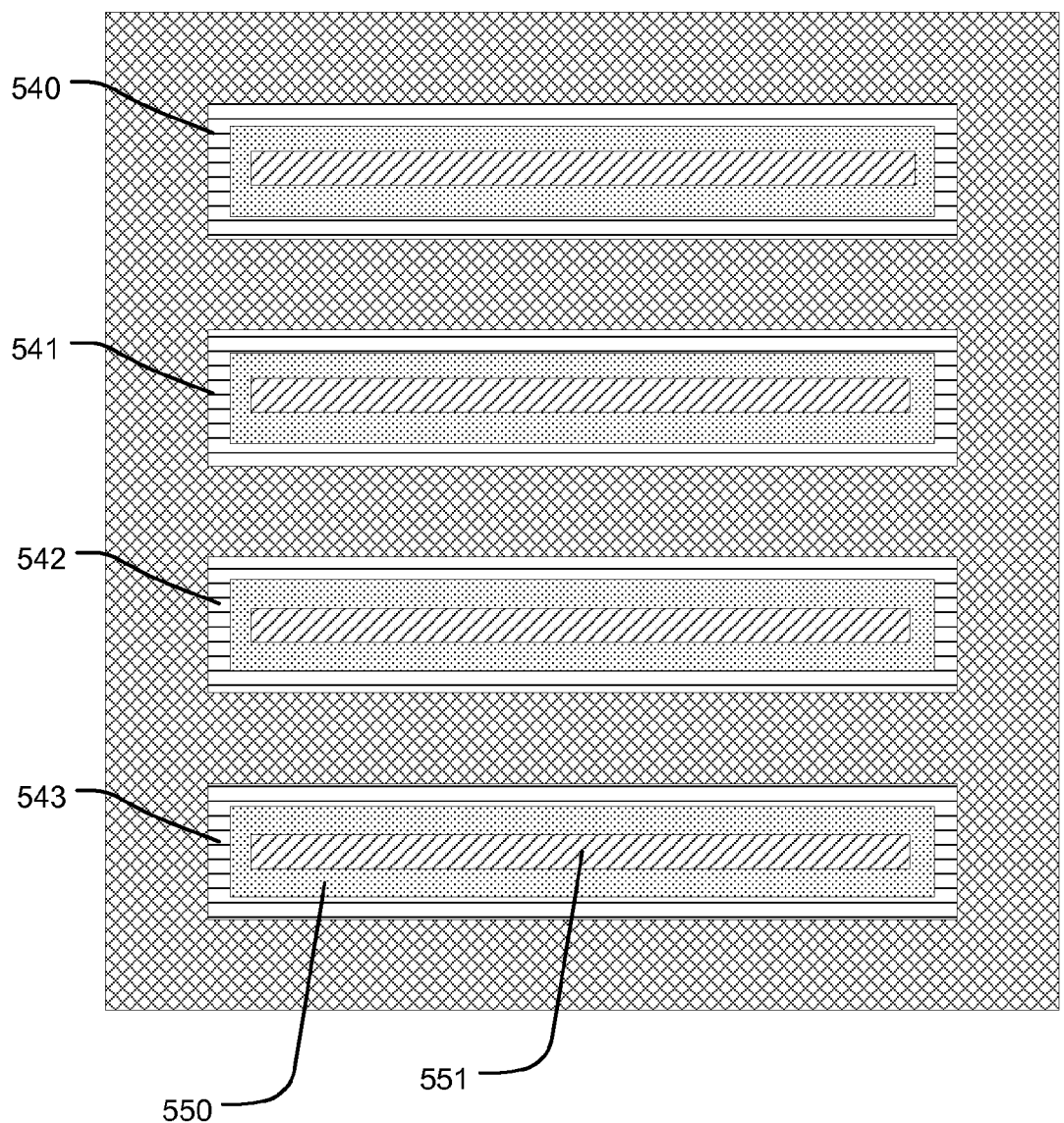
FIGS. 23-26 illustrate stages in manufacture of the structure of FIG. 22.

FIG. 23 illustrates a stage in a process for manufacturing the structure shown in FIG. 22. Starting with a structure like that shown in FIG. 9, after formation of a dielectric charge trapping structure 540, 541, 542, 543 on the side walls of trenches, a layer of amorphous silicon 550 is deposited and etched to form the sidewalls within the trenches, leaving a more narrow trench inside the amorphous silicon layer 550. Prior to forming the silicon layer 550, the sacrificial silicon layer can be formed over the dielectric charge trapping material, and then etched while protecting the side surfaces of the dielectric charge trapping structure, to open the bottoms of the trenches to expose the underlying contacts to the decoding array. The silicon layer 550 can be intrinsic silicon or lightly doped depending on the implementation. The more narrow trenches are filled with a dielectric 551 such as silicon dioxide.

Figure 24:
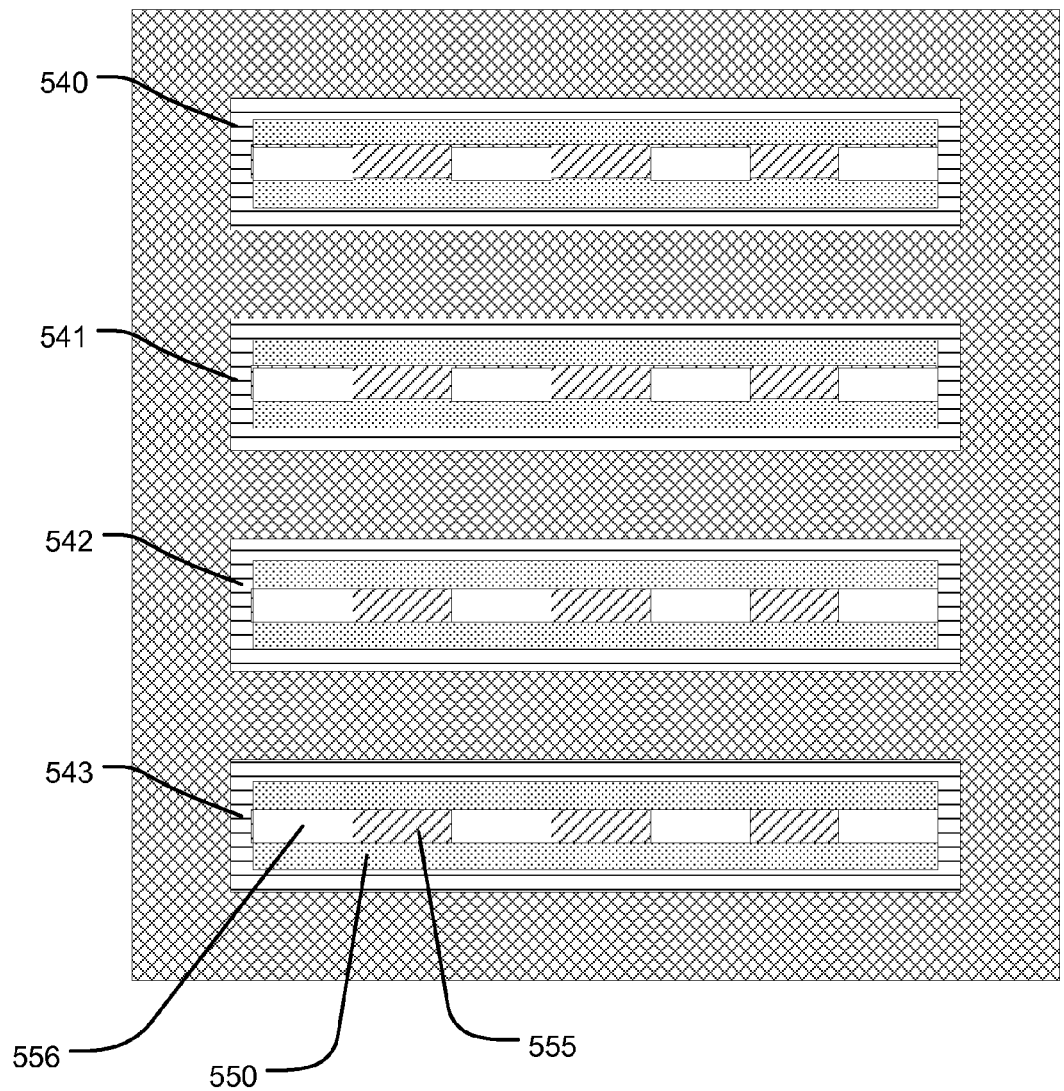

FIG. 24 illustrates a next stage in the process. A lithographic process is used to define strips orthogonal to the word lines, and then the dielectric 551 is removed between the strips create openings (e.g. 556) between dielectric columns (e.g. 555).

A thin film of N-type silicon, or in the alternative an n-type dopant-plasma treatment applied to the thin body layers 550, is then used to create an implant region.

Figure 25:
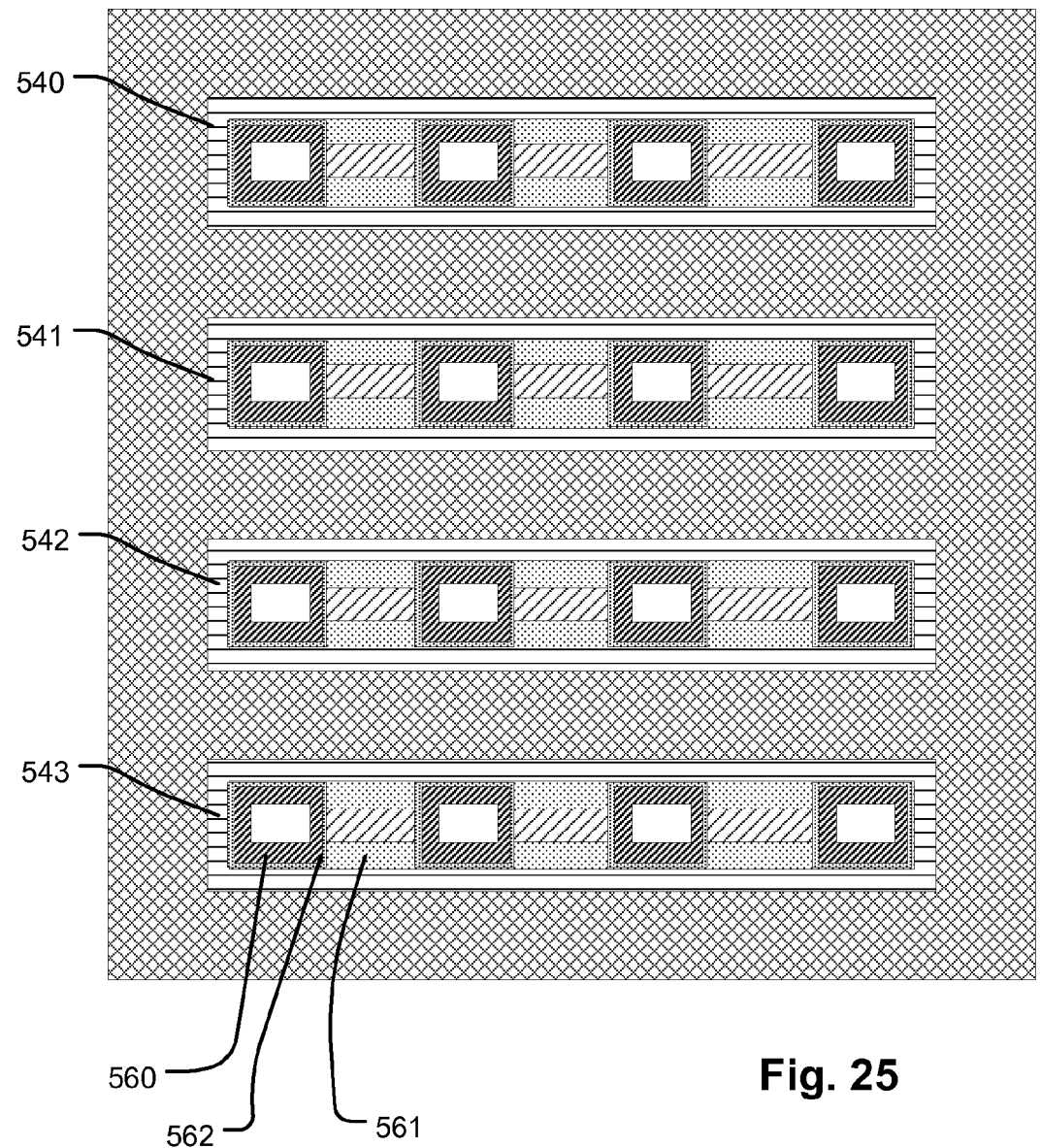

FIG. 25 illustrates a next stage, after deposition of a metal precursor on the side walls for silicide formation using chemical vapor deposition for example. Suitable metals which can be utilized as silicide precursors include tungsten, titanium, cobalt and others known in the art. After deposition of the metal precursor, the structure is annealed to form the silicide columns of 560 with thin doped semiconductor layers 562, adjacent thin semiconductor body layers 561.

Figure 26:
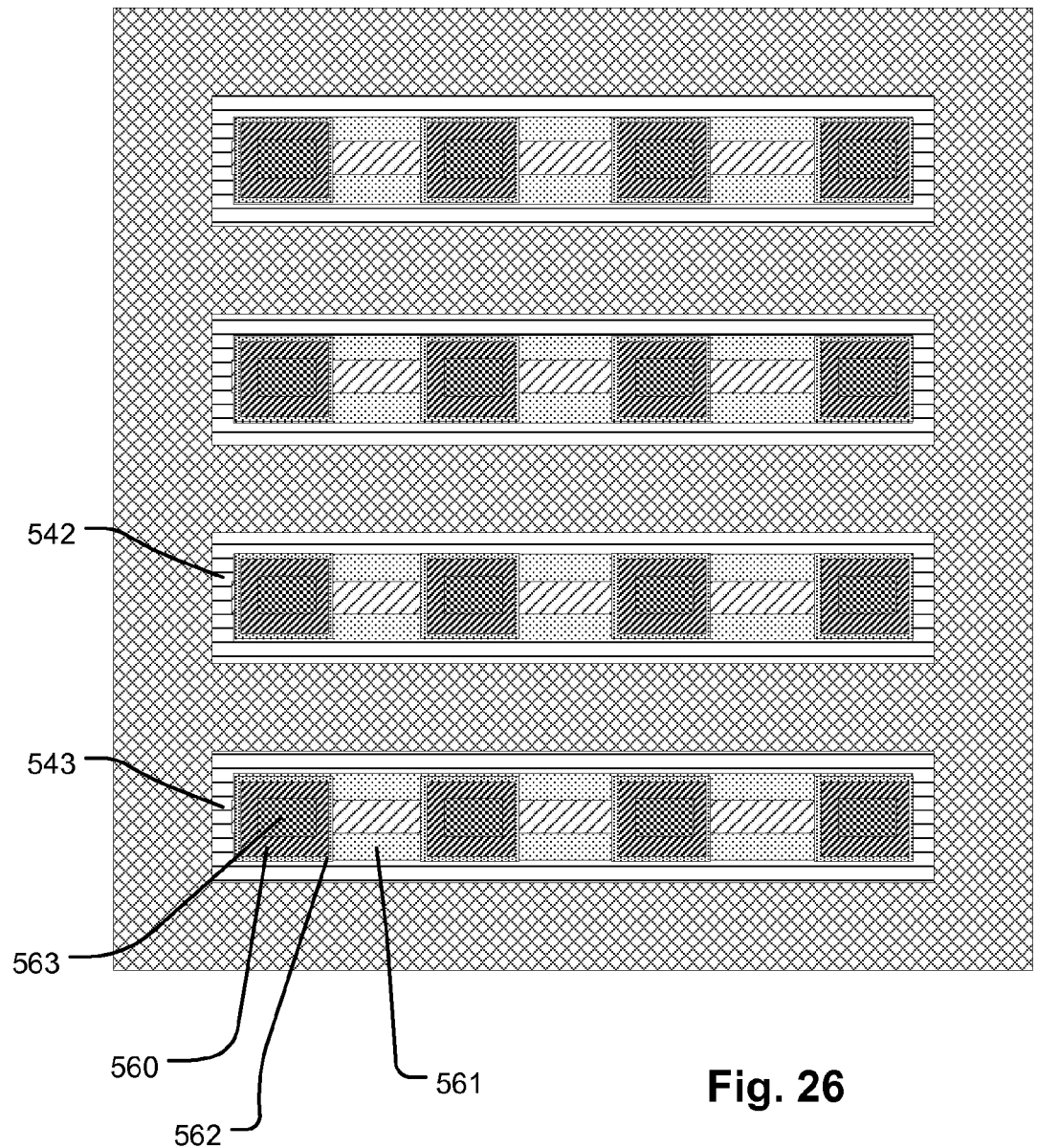

FIG. 26 illustrates a next stage, after filling the openings inside the silicide column 560 with a metal such as tungsten to form conductive core 563 in the bit line pillars.

After formation of the structure shown in FIG. 26, the process proceeds as described above to form the left and the right word line structures and so on to complete the three-dimensional array.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method for manufacturing a memory device, comprising:
    providing a substrate including an array of access devices and a first set of bit lines, the substrate having a surface with an array of contacts, including contacts coupled to access devices in the array of access devices and contacts coupled to bit lines in the set of bit lines;
    forming a stack of alternating layers of word line material and insulating material over the array of contacts;
    forming trenches in the stack, the trenches exposing respective rows of contacts on the surface of the substrate coupled to access devices and exposing contacts on the surface of the substrate coupled to bit lines in the first set of bit lines, and having sidewalls exposing word line material in the layers of word line material in the stack;
    forming a charge trapping structure, lining the sidewalls of the trenches at least on word line material exposed on sidewalls of the trenches;
    forming semiconductor body pillars within the trenches over the charge trapping structure, the semiconductor body pillars contacting respective contacts in the rows of contacts in the trenches;
    forming bit line pillars within the trenches on first and second opposing sides of the semiconductor body pillars and within the trenches, where bit line pillars on the first side of the semiconductor body pillars contact respective contacts coupled to a bit line in the first set of bit lines; and
    forming a second set of bit lines coupled to the bit line pillars on the second opposing side of the semiconductor body pillars.

2. The method of claim 1, wherein said forming semiconductor body pillars includes filling the trenches with doped semiconductor material over the charge trapping structure, and then applying a patterned etch process to remove the doped semiconductor material within the trenches to leave said semiconductor body pillars.

3. The method of claim 1, wherein said forming bit line pillars includes filling regions left by said patterned etch process with bit line material to provide said bit line pillars.

4. The method of claim 1, wherein said forming bit line pillars includes providing a semiconductor pillar having a metal or metal silicide core as said bit line pillars.

5. The method of claim 1, wherein said forming a charge trapping structure includes forming a multilayer stack of dielectric materials on the sidewalls of the trenches, the multilayer stack including a tunneling layer, a charge trapping layer and a blocking layer.

6. The method of claim 1, wherein said tunneling layer is formed adjacent the sidewalls of the trenches.

7. The method of claim 1, wherein said forming trenches includes using a first lithographic mask to define a pattern for the trenches, and said forming semiconductor body pillars includes using a second lithographic mask to define a pattern for the semiconductor body pillars in the trenches.

8. The method of claim 1, including etching the stack to define left side word line structures including a plurality of word lines between alternating pairs of trenches, and right side word line structures including a second plurality of word lines interleaved with the first plurality of word lines between alternating pairs of trenches.

9. The method of claim 1, including forming insulating pillars in the trenches, between bit line pillars on the second opposing side of a first semiconductor body pillar and a bit line pillar of the first opposing side of a second semiconductor body pillar.

10. A method for manufacturing a memory device, comprising:
   forming a stack of alternating layers of conductive material and insulating material;
   forming trenches in the stack having sidewalls exposing conductive material in the layers of conductive material in the stack;
   forming a charge trapping structure, lining the sidewalls of the trenches at least on conductive material exposed on sidewalls of the trenches;
   forming semiconductor body pillars within the trenches over the charge trapping structure; and
   forming conductive pillars within the trenches on first and second opposing sides of the semiconductor body pillars and within the trenches.

11. The method of claim 10, wherein said forming semiconductor body pillars includes filling the trenches with semiconductor material over the charge trapping structure, and then applying a patterned etch process to remove the semiconductor material within the trenches to leave said semiconductor body pillars.

12. The method of claim 11, wherein said forming conductive pillars includes filling regions left by said patterned etch process with conductive material to provide said conductive pillars.

13. The method of claim 10, wherein said forming conductive pillars includes providing a semiconductor pillar having a metal or metal silicide core as said conductive pillars.

14. The method of claim 10, wherein said forming a charge trapping structure includes forming a multilayer stack of dielectric materials on the sidewalls of the trenches, the multilayer stack including a tunneling layer, a charge trapping layer and a blocking layer.

15. The method of claim 10, wherein said tunneling layer is formed adjacent the sidewalls of the trenches.

16. The method of claim 10, wherein said forming trenches includes using a first lithographic mask to define a pattern for the trenches, and said forming semiconductor body pillars includes using a second lithographic mask to define a pattern for the semiconductor body pillars in the trenches.

17. The method of claim 10, including etching the stack to define left side word line structures including a first plurality of conductive lines between alternating pairs of trenches, and right side word line structures including a second plurality of conductive lines interleaved with the first plurality of conductive lines between alternating pairs of trenches.

18. The method of claim 10, including forming insulating pillars in the trenches, between conductive pillars on the second opposing side of a first semiconductor body pillar and a conductive pillar of the first opposing side of a second semiconductor body pillar.

* * * * *